United States Patent
Lee et al.

(10) Patent No.: US 8,173,549 B2
(45) Date of Patent: May 8, 2012

(54) METHODS OF FORMING SEMICONDUCTOR DEVICE PATTERNS

(75) Inventors: Young-ho Lee, Seoul (KR); Jae-hwang Sim, Seoul (KR); Jae-kwan Park, Gyeonggi-do (KR); Jong-min Lee, Ulsan (KR); Mo-seok Kim, Gyeonggi-do (KR); Hyon-woo Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 490 days.

(21) Appl. No.: 12/477,468

(22) Filed: Jun. 3, 2009

(65) Prior Publication Data

US 2009/0298276 A1 Dec. 3, 2009

(30) Foreign Application Priority Data

Jun. 3, 2008 (KR) ........................ 10-2008-0052256
Sep. 23, 2008 (KR) ........................ 10-2008-0093369

(51) Int. Cl.
*H01L 21/302* (2006.01)

(52) U.S. Cl. .......... 438/706; 438/723; 438/725; 216/67; 216/79

(58) Field of Classification Search ........................ None
See application file for complete search history.

(56) References Cited

FOREIGN PATENT DOCUMENTS

| JP | 2006-351861 | | 12/2006 |
|---|---|---|---|
| KR | 1020060110706 | * | 10/2006 |
| KR | 1020060110706 A | | 10/2006 |
| KR | 1020060134598 A | | 12/2006 |

* cited by examiner

*Primary Examiner* — Kiesha Bryant
*Assistant Examiner* — Pamela E Perkins
(74) *Attorney, Agent, or Firm* — Myers Bigel Sibley & Sajovec, P.A.

(57) ABSTRACT

A first mask layer pattern including a plurality of parallel line portions is formed on an etch target layer on a semiconductor substrate. A sacrificial layer is formed on the first mask layer pattern and portions of the etch target layer between the parallel line portions of the first mask layer pattern. A second mask layer pattern is formed on the sacrificial layer, the second mask layer pattern including respective parallel lines disposed between respective adjacent ones of the parallel line portions of the first mask layer pattern, wherein adjacent line portions of the first mask layer pattern and the second mask layer pattern are separated by the sacrificial layer. A third mask layer pattern is formed including first and second portions covering respective first and second ends of the line portions of the first mask layer pattern and the second mask layer pattern and having an opening at the line portions of the first and second mask layer patterns between the first and second ends. The sacrificial layer and the etch target layer are etched using the third mask layer pattern, the first mask layer pattern and the second mask layer pattern as a mask to thereby form a plurality of parallel trenches in the etch target layer between the line portions of the first and second mask layer patterns. Conductive lines may be formed in the trenches.

20 Claims, 27 Drawing Sheets

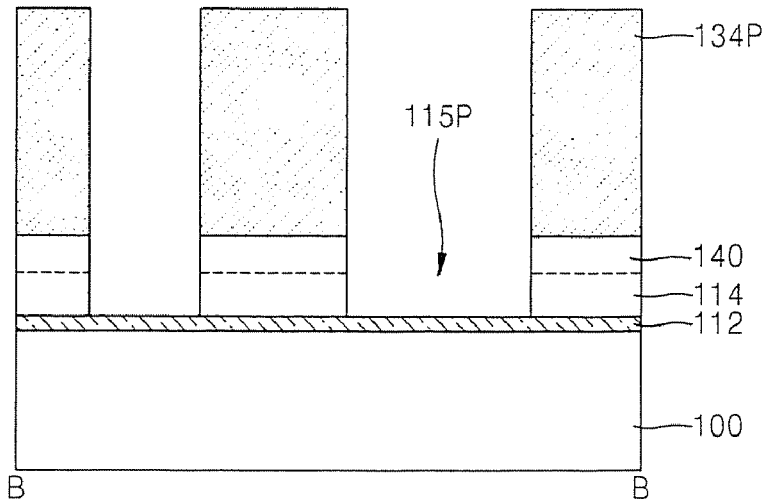
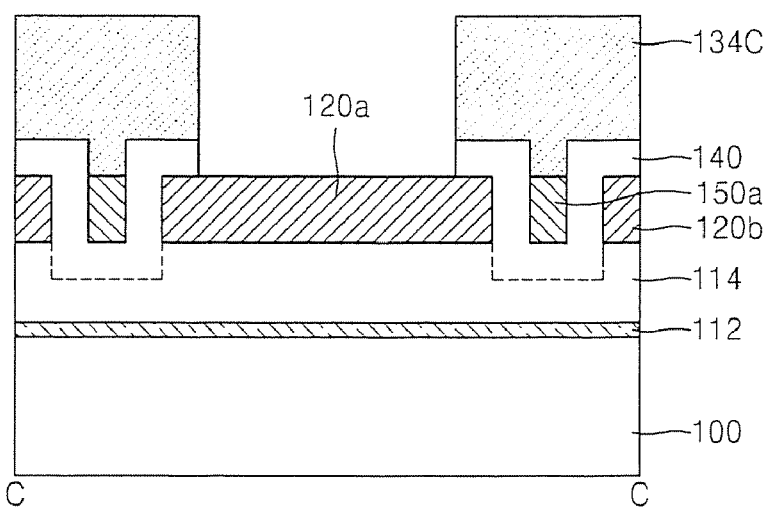
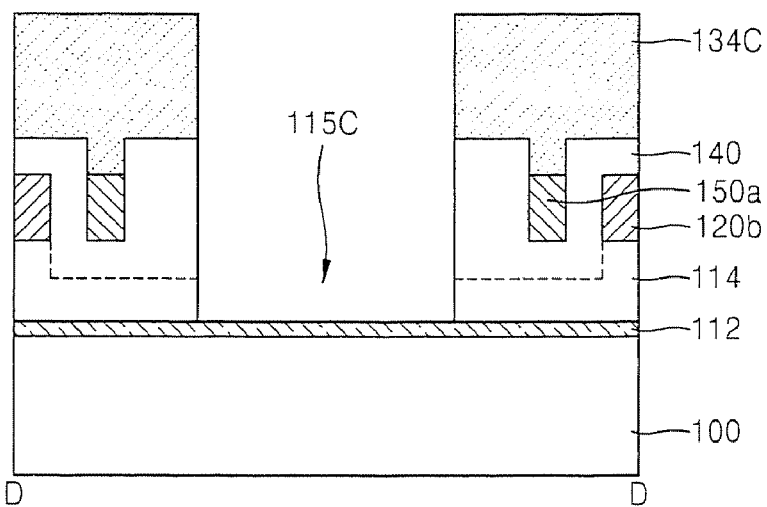

METHODS OF FORMING SEMICONDUCTOR DEVICE PATTERNS

CROSS-REFERENCE TO RELATED APPLICATIONS

This application claims the benefit of Korean Patent Application Nos. 10-2008-0052256, filed on Jun. 3, 2008, and 10-2008-0093369, filed on Sep. 23, 2008 in the Korean Intellectual Property Office, the disclosures of which are incorporated herein their entirety by reference.

BACKGROUND

The present invention relates to methods of forming semiconductor devices and, more particularly, to methods of forming semiconductor device patterns.

A sharp reduction of design rules with respect to a semiconductor memory device has led to use of a damascene technology to form metal lines including copper having excellent conductivity. Decreases in design rules have also led to use of a double patterning technology capable of overcoming the resolution limits of a photolithography stepper used to form a minute pattern.

SUMMARY

Some embodiments of the present invention provide methods of forming semiconductor device patterns. A first mask layer pattern including a plurality of parallel line portions is formed on an etch target layer on a semiconductor substrate. A sacrificial layer is formed on the first mask layer pattern and on portions of the etch target layer between the parallel line portions of the first mask layer pattern. A second mask layer pattern is formed on the sacrificial layer, the second mask layer pattern including respective parallel lines disposed between respective adjacent ones of the parallel line portions of the first mask layer pattern, wherein adjacent line portions of the first mask layer pattern and the second mask layer pattern are separated by the sacrificial layer. A third mask layer pattern is formed including first and second portions covering respective first and second ends of the line portions of the first mask layer pattern and the second mask layer pattern and having an opening at the line portions of the first and second mask layer patterns between the first and second ends. The sacrificial layer and the etch target layer are etched using the third mask layer pattern, the first mask layer pattern and the second mask layer pattern as a mask to thereby form a plurality of parallel trenches in the etch target layer between the line portions of the first and second mask layer patterns. The third mask layer pattern may further include a third portion having an opening at a peripheral circuit region, and etching the sacrificial layer and the etch target layer using the third mask layer pattern, the first mask layer pattern and the second mask layer pattern as a mask to thereby form a plurality of parallel trenches in the etch target layer between the line portions of the first and second mask layer patterns may include forming a trench in the peripheral circuit region.

In some embodiments, forming a sacrificial layer may be preceded by forming recesses in the etch target layer between the line portions of the first mask layer pattern, and forming a sacrificial layer may include forming the sacrificial layer in the recesses. The etch target layer may include an insulating layer. The sacrificial layer may include the same material as the etch target layer. The first mask layer pattern and the second mask layer pattern may include the same material. For example, the first mask layer pattern and the second mask layer pattern may each include polysilicon.

In some embodiments, forming a second mask layer pattern includes forming a mask layer on the sacrificial layer filling recesses in the sacrificial layer between the line portions of the first mask layer pattern and etching back the mask layer to expose the sacrificial layer and form the second mask layer pattern. Etching back the mask layer may include etching bask the mask layer to form a second mask pattern with a thickness approximately equal to a thickness of the first mask layer pattern. In further embodiments, etching the sacrificial layer and the etch target layer using the third mask layer pattern, the first mask layer pattern and the second mask layer pattern as a mask to thereby form a plurality of parallel trenches in the etch target layer between the line portions of the first and second mask layer patterns includes selectively etching the sacrificial layer using the third mask layer pattern as a mask to expose the etch target layer and etching the etch target layer using the first mask layer pattern and the second mask layer pattern as a mask to form the parallel trenches.

In additional embodiments, the methods further include removing the third mask layer pattern and removing the first mask layer pattern and the second mask layer pattern. A conductive layer may be formed filling the parallel trenches. The conductive layer may be chemical mechanical polished to expose the etch target layer and form parallel conductive lines in the parallel trenches. The conductive layer may include a copper layer.

According to further embodiments of the present invention, methods of forming semiconductor device patterns include forming an etch target layer on a semiconductor substrate including a first region and a second region, forming a first mask layer pattern including a plurality of parallel line portions on the etch target layer in the first region, forming a sacrificial layer having a uniform thickness on the first mask layer pattern and forming a second mask layer pattern on the sacrificial layer. The second mask layer pattern includes respective parallel line portions disposed between respective adjacent ones of the parallel line portions of the first mask layer pattern in the first region, wherein adjacent line portions of the first mask layer pattern and the second mask layer pattern are separated by the sacrificial layer. A third mask layer pattern is formed including first and second portions covering respective first and second ends of the line portions of the first mask layer pattern and the second mask layer pattern and having an opening at the line portions of the first and second mask layer patterns between the first and second ends in the first region and a third portion having an opening in the second region. The sacrificial layer and the etch target layer are etched using the third mask layer pattern, the first mask layer pattern and the second mask layer pattern as a mask to thereby form a plurality of parallel first trenches in the etch target layer between the line portions of the first and second mask layer patterns in the first region and a second trench in the second region.

In some embodiments, forming a sacrificial layer may be preceded by forming recesses in the etch target layer between the line portions of the first mask layer pattern, and forming a sacrificial layer may include forming the sacrificial layer in the recesses. The etch target layer may include an insulating layer. Forming a third mask layer pattern may include forming a mask layer on the second mask layer pattern to thereby form a planar surface in the first region and the second region, forming a fourth mask layer pattern on the mask layer, and etching the mask layer using the fourth mask layer pattern as a mask to form the third mask layer pattern. The mask layer may include one of a spin on hardmask (SOH) layer and a spin on glass (SOG) layer. The first, second and third third mask layer patterns may be removed. A conductive layer may be formed filling the first trenches and chemical mechanical polished to expose the etch target layer and form a plurality of parallel conductive lines in the etch target layer.

BRIEF DESCRIPTION OF THE DRAWINGS

Exemplary embodiments of the present invention will be more clearly understood from the following detailed description taken in conjunction with the accompanying drawings in which.

DETAILED DESCRIPTION

Figure 1A:
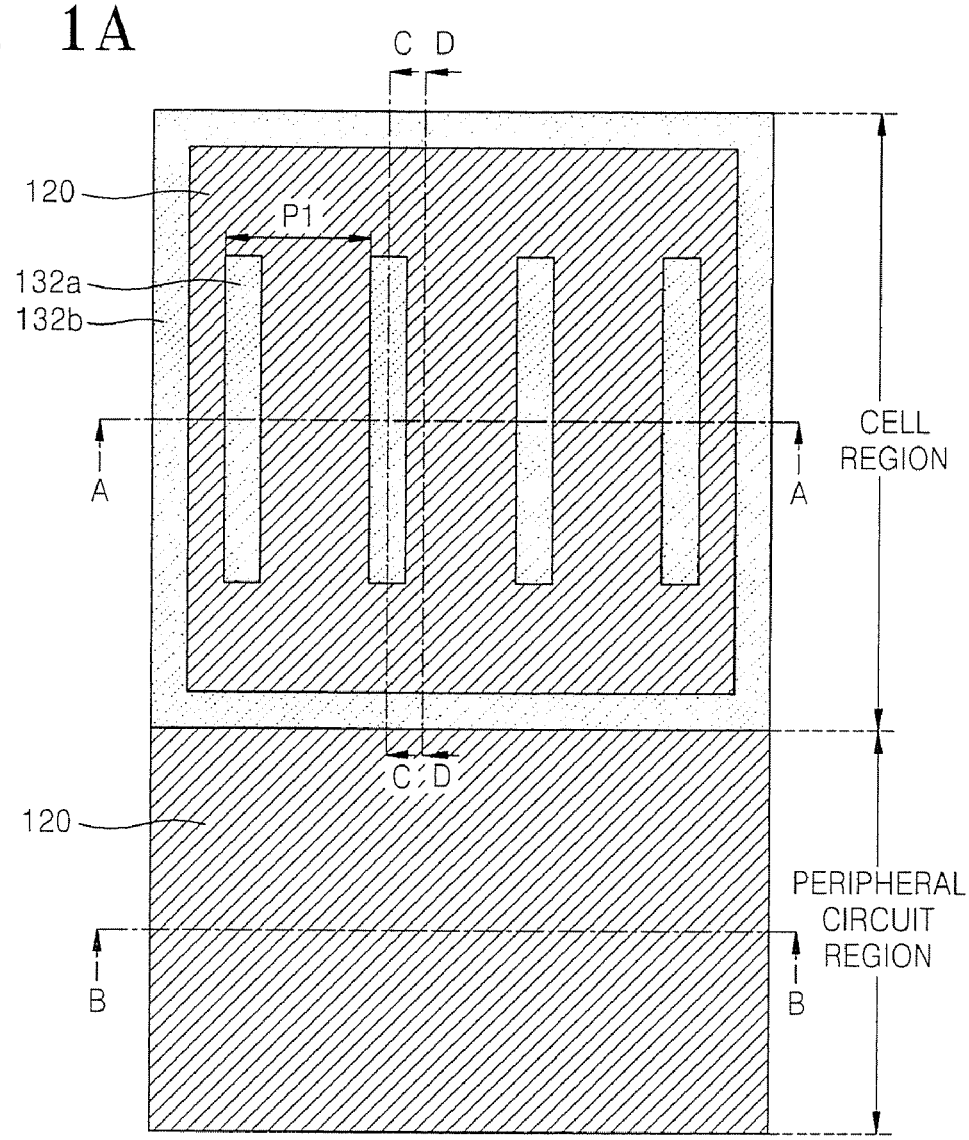
FIGS. 1A, 2A, . . . , 8A, and 9A are plane views orderly illustrating a fabrication process for a semiconductor device according to some embodiments of the present invention.

The present invention now will be described more fully hereinafter with reference to the accompanying drawings, in which various embodiments are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as The terminology used herein is for the purpose of describing particular embodiments only and is not intended to be limiting of the invention. As used herein, the singular forms "a," "an" and "the" are intended to include the plural forms as well, unless the context clearly indicates otherwise.

It will be further understood that the terms "comprises," "comprising," "having," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below. However, as used herein, and as conventionally used, the "vertical" direction is generally orthogonal to the face of the substrate regardless of its orientation, whereas the "horizontal" direction is generally parallel to (extending along) the face of the substrate.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In some embodiments of the present invention, a damascene trench includes a trench which is formed in an insulating layer and which is filled with a material forming a pattern, and in this manner, the pattern is formed according to a damascene technology. Also, a cell trimming pattern in one or more embodiments of the present invention functions to divide a pattern into separate line patterns, wherein the pattern is formed using a double patterning technology so as to form a line in which both ends of two adjacent damascene patterns (including trenches) are connected to each other.

Figure 1B:
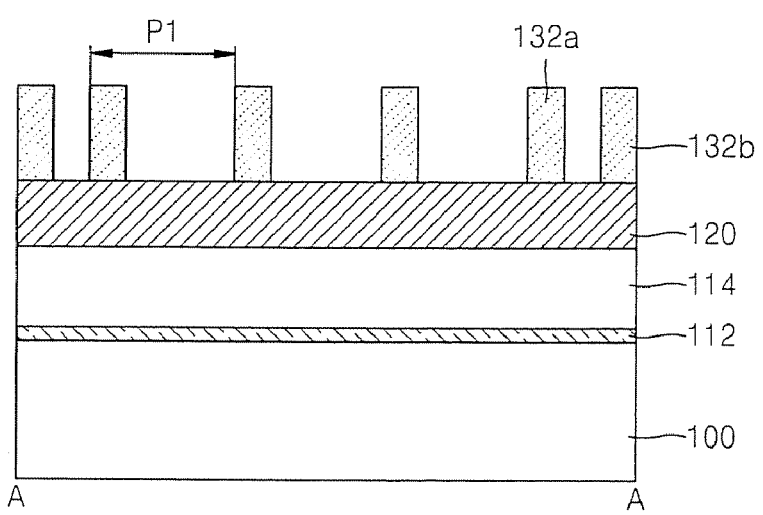
FIGS. 1B, 2B, . . . , 8B, and 9B are cross-sectional views respectively taken along a line A-A of FIGS. 1A, 2A, . . . , 8A, and 9A.
Figure 1C:
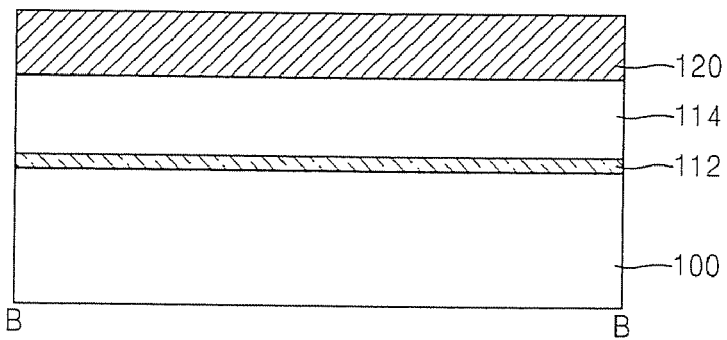
FIGS. 1C, 2C, . . . , 8C, and 9C are cross-sectional views respectively taken along a line B-B of FIGS. 1A, 2A, . . . , 8A, and 9A.
Figure 1D:
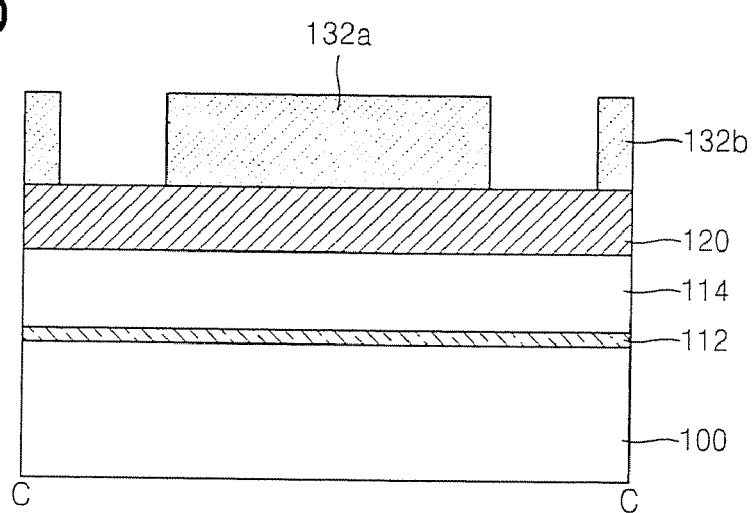
FIGS. 1D, 2D, . . . , 8D, and 9D are cross-sectional views respectively taken along a line C-C of FIGS. 1A, 2A, . . . , 8A, and 9A.
Figure 1E:
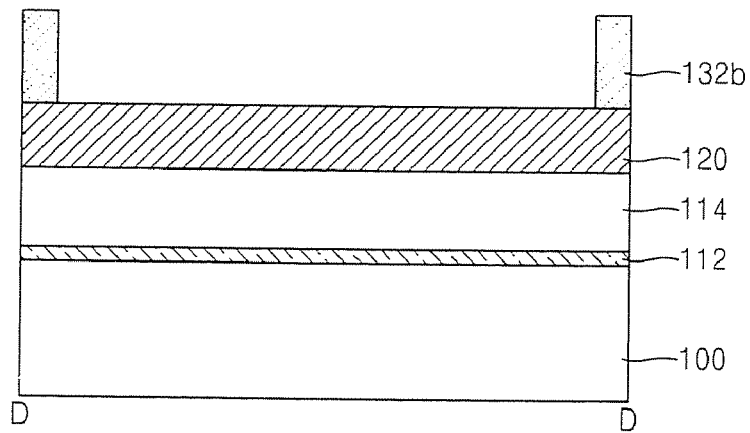
FIGS. 1E, 2E, . . . , 8E, and 9E are cross-sectional views respectively taken along a line D-D of FIGS. 1A, 2A, . . . , 8A, and 9A.
Figure 2A:
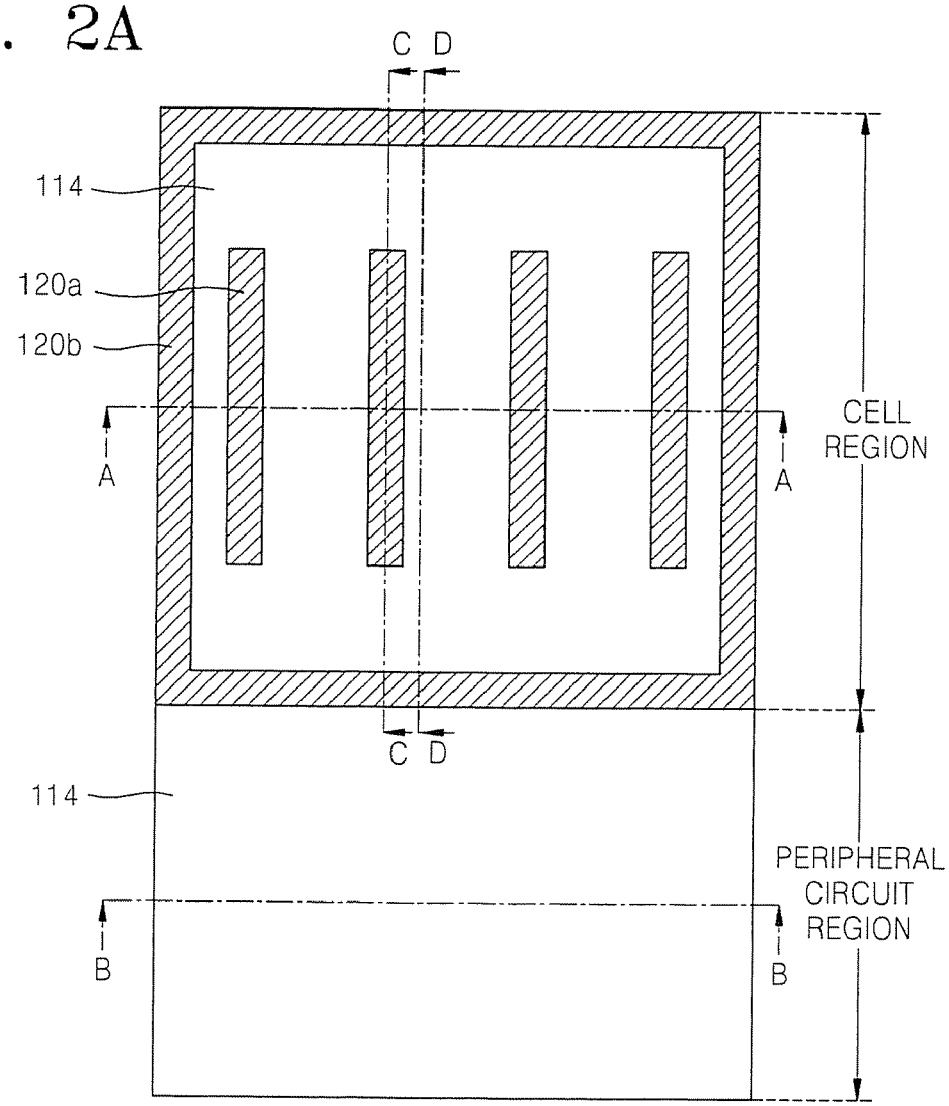
Figure 2B:
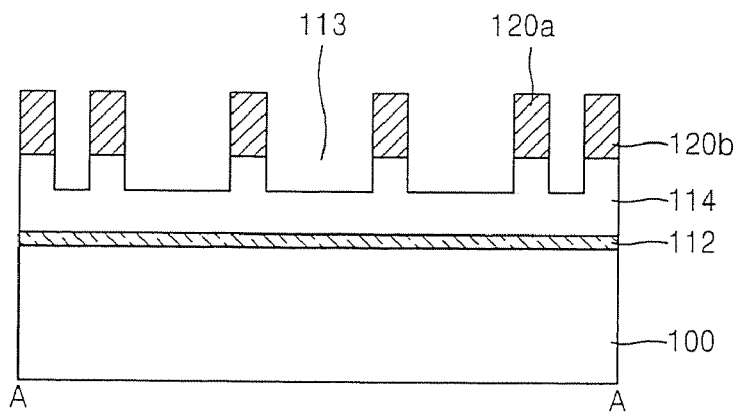
Figure 2C:
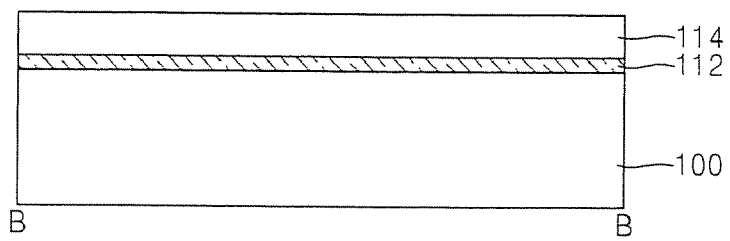
Figure 2D:
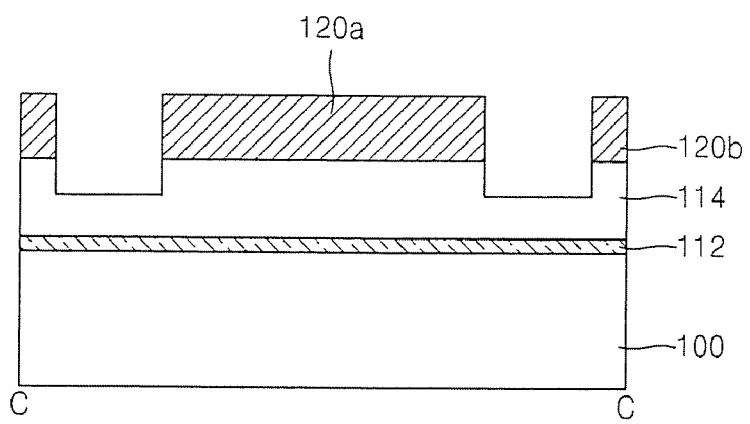
Figure 2E:
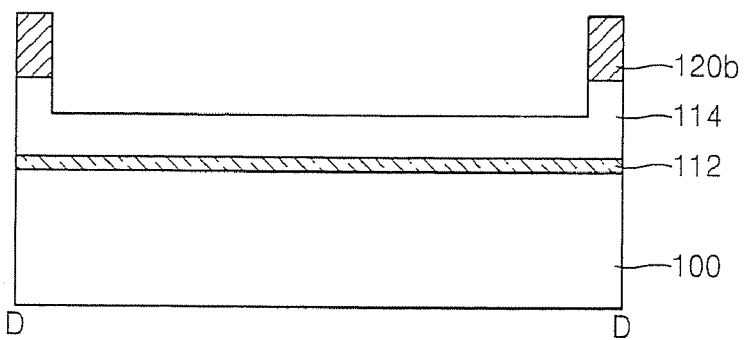

FIGS. 1A, 2A, . . . , 8A, and 9A are plane views orderly illustrating a fabrication process for a semiconductor device according to some embodiments of the present invention. FIGS. 1B, 2B, . . . , 8B, and 9B are cross-sectional views respectively taken along a line A-A of FIGS. 1A, 2A, . . . , 8A, and 9A. FIGS. 1C, 2C, . . . , 8C, and 9C are cross-sectional views respectively taken along a line B-B of FIGS. 1A, 2A, . . . , 8A, and 9A. FIGS. 1D, 2D, . . . , 8D, and 9D are cross-sectional views respectively taken along a line C-C of FIGS. 1A, 2A, . . . , 8A, and 9A. FIGS. 1E, 2E, . . . , 8E, and 9E are cross-sectional views respectively taken along a line D-D of FIGS. 1A, 2A, . . . , 8A, and 9A. According to FIGS. 1A through 9E, a peripheral circuit region is positioned below a cell region. However, the position of the peripheral circuit region is not limited thereto, and the peripheral circuit region may be positioned in an area other than the cell region.

Referring to FIGS. 1A through 1E, a first mask layer 120 is formed on a semiconductor substrate 100 on which an etch stopping layer 112 and an etch target layer 114 are sequentially formed. A damascene pattern is to be formed in the etch target layer 114, and the etch stopping layer 112 functions to prevent the semiconductor substrate 100 from being etched when the etch target layer 114 is etched to form the damascene pattern. The semiconductor substrate 100 may include various sub-structures according to the damascene pattern to be formed. The etch target layer 114 whereon the damascene pattern will be formed may be formed as an insulating layer, and the first mask layer 120 may be formed of a material having an etch selectivity with respect to the etch target layer 114. For example, if the etch target layer 114 is formed as a silicon oxide layer, the first mask layer 120 may be formed of polysilicon. The etch stopping layer 112 may be formed of a material such as silicon nitride that has an etch selectivity with respect to the silicon oxide layer and the polysilicon.

After that, by using a first photomask to define a line and space pattern of the cell region, a first photoresist pattern 132a is formed on the first mask layer 120 of the cell region. The first mask layer 120 of the peripheral circuit region is open. The first photoresist pattern 132a may be formed with a first pitch P1 that is twice as wide as a pitch of the damascene pattern to be finally formed. In addition to the first photoresist pattern 132a, a first photoresist blocking pattern 132b may be further formed to prevent a portion of the etch target layer 114 from being etched, wherein the damascene pattern is not formed on this portion. The first photoresist blocking pattern 132b may be formed to be separated from ends of the adjacent first photoresist patterns 132a, or may be formed to contact the ends of the adjacent first photoresist patterns 132a.

Referring to FIGS. 2A through 2E, the first mask layer 120 is etched by using the first photoresist pattern 132a as a mask so that a first mask layer pattern 120a is formed in the cell region. A first mask layer blocking pattern 120b corresponding to the first photoresist blocking pattern 132b may also be formed. When the first mask layer 120 is etched, a recess 113 may be formed in the etch target layer 114 by over-etching the etch target layer 114. A depth of the recess 113 may be determined according to a thickness of a sacrificial layer 140 (see FIGS. 3A through 3E) that is to be formed on the etch target layer 114 in a following process.

Referring to FIGS. 3A through 3E, the sacrificial layer 140 is formed to a substantially uniform thickness above the entire surface of the semiconductor substrate 100 so as to cover the first mask layer pattern 120a. The sacrificial layer 140 may be formed of a material forming the etch target layer 114, or may be formed of a material having an approximately equal etch selectivity or a similar etch selectivity with respect to the etch target layer 114. For example, in the case where the etch target layer 114 is formed as a silicon oxide layer, the sacrificial layer 140 may also be formed as the silicon oxide layer. The sacrificial layer 140 may be formed using, for example, an Atomic Layer Deposition (ALD) method or using a Chemical Vapor Deposition (CVD) method, which may have excellent performance with respect to a step coverage.

Figure 3A:
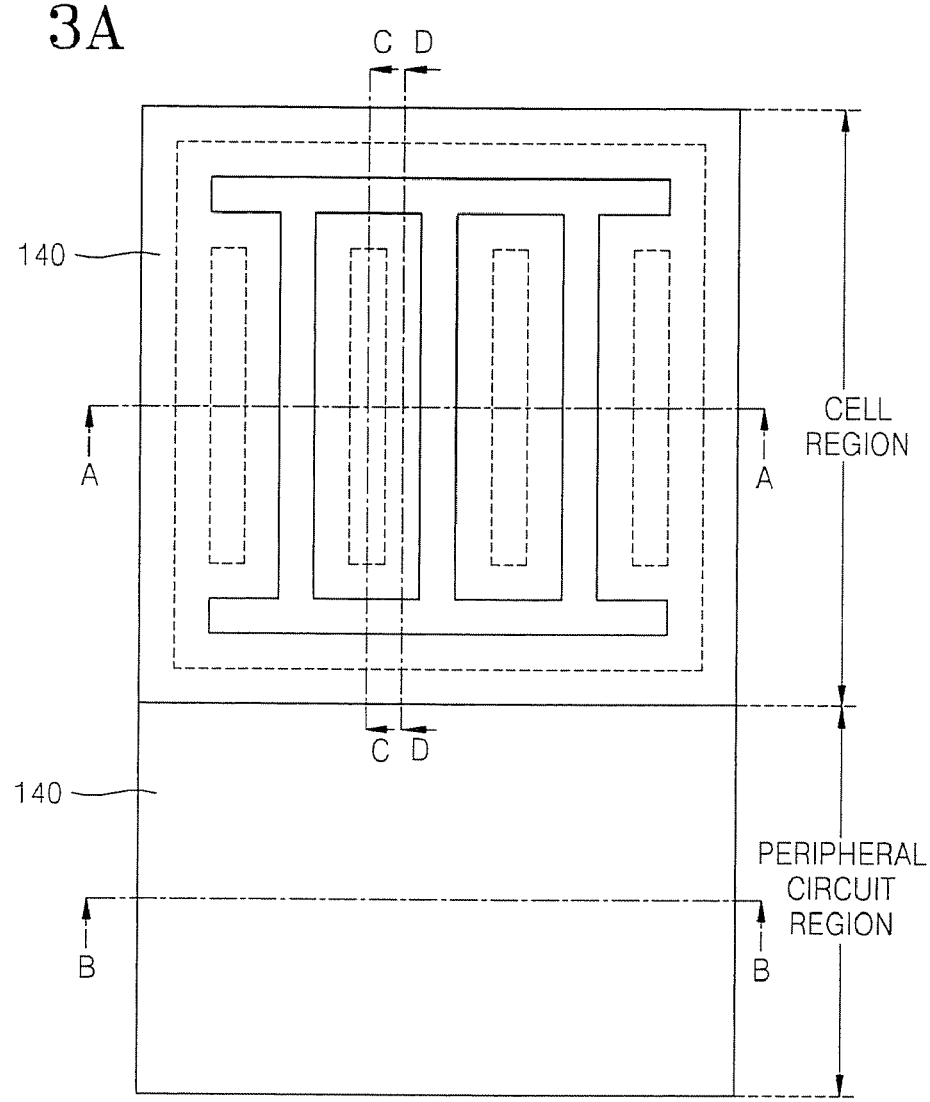
Figure 3B:
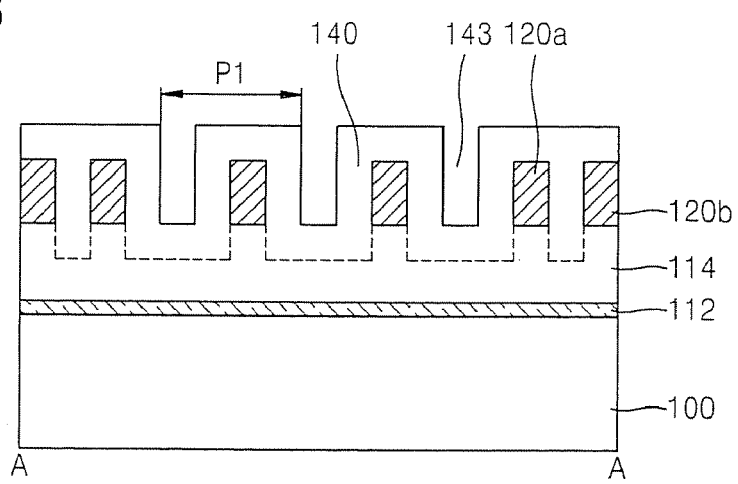
Figure 3C:
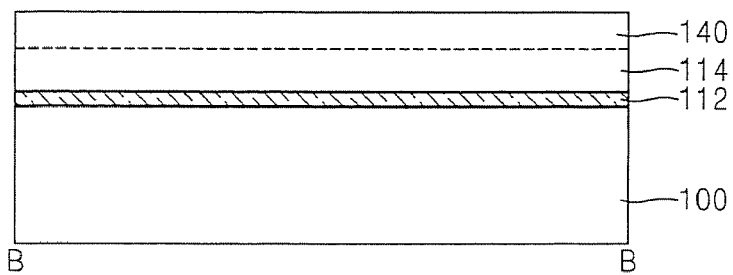
Figure 3D:
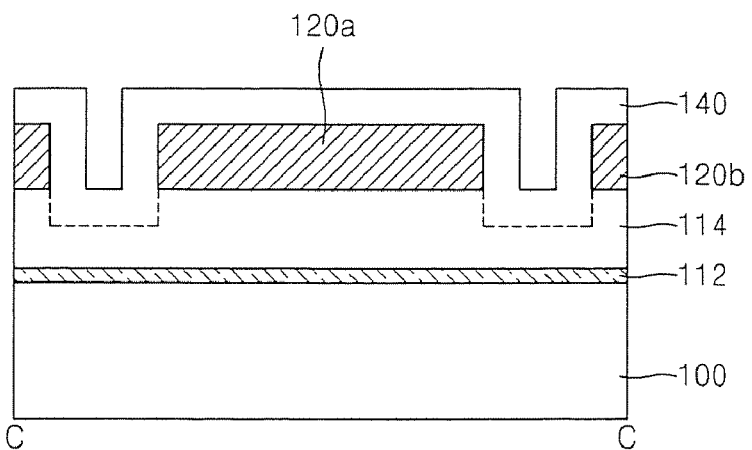
Figure 3E:
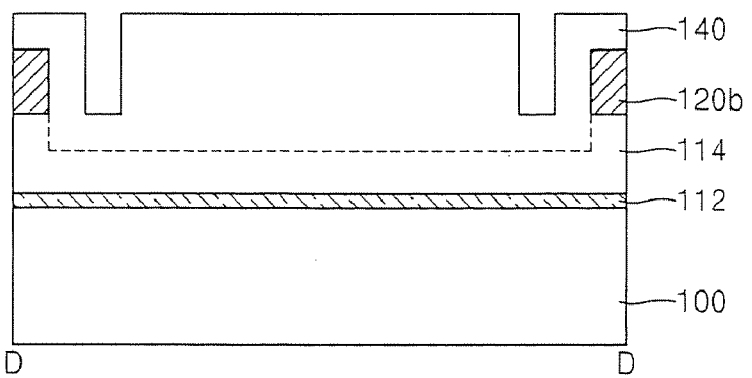
Figure 4A:
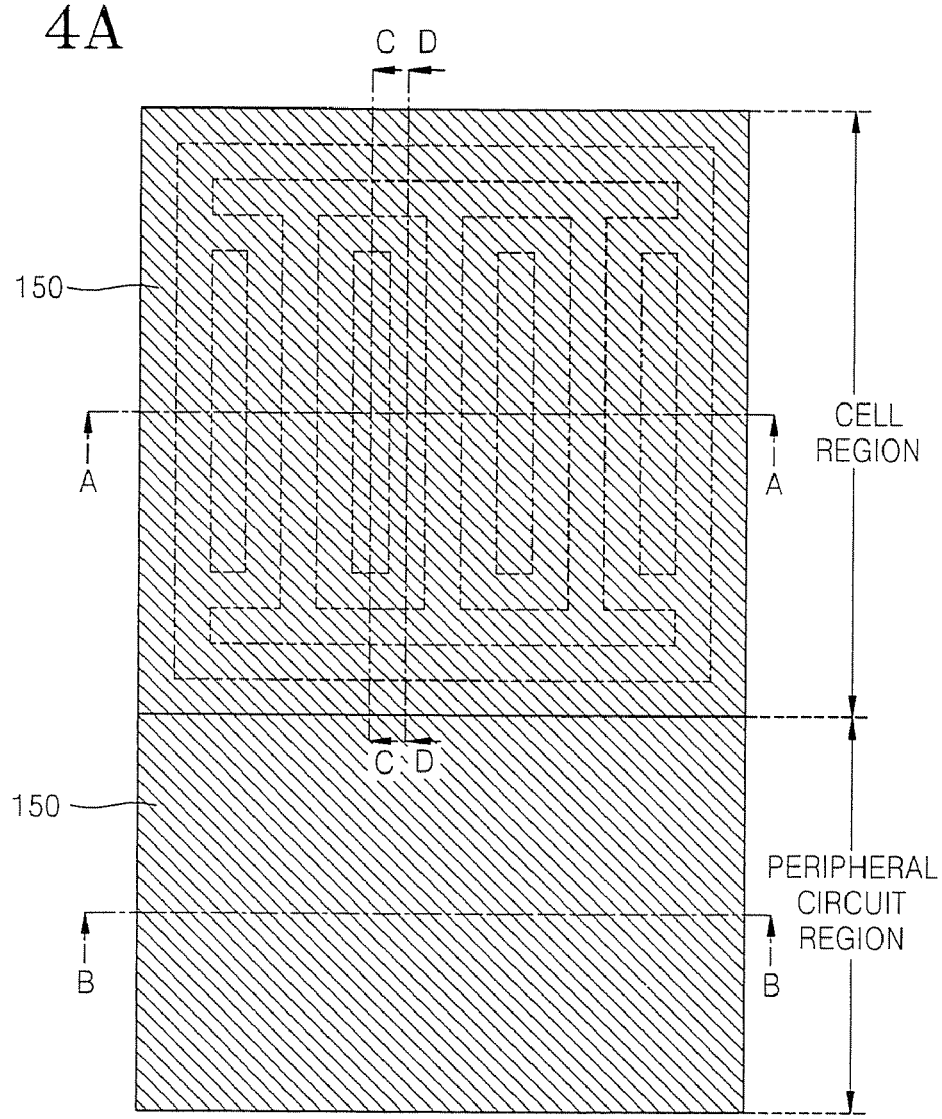
Figure 4B:
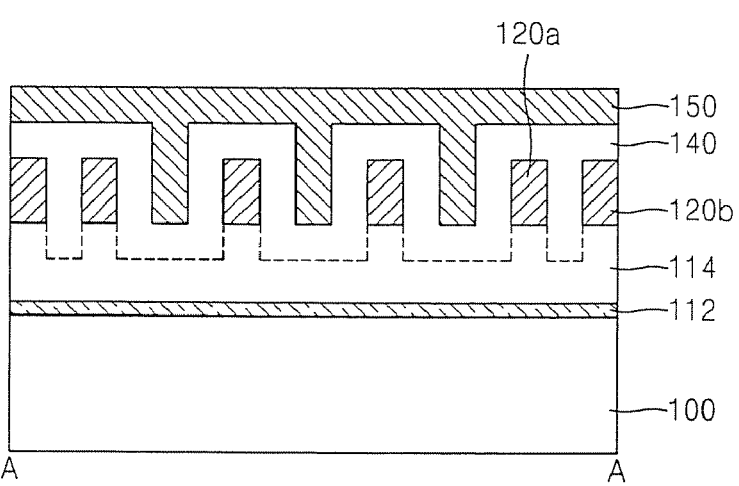
Figure 4C:
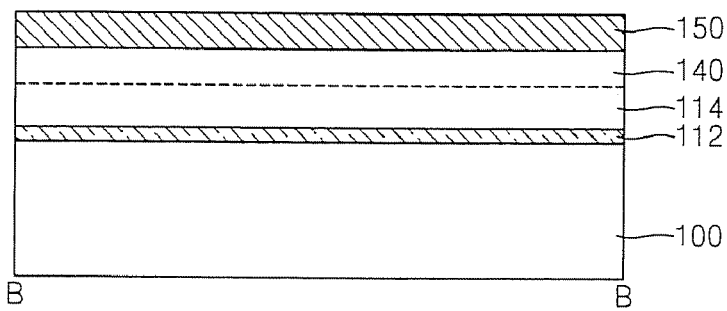
Figure 4D:
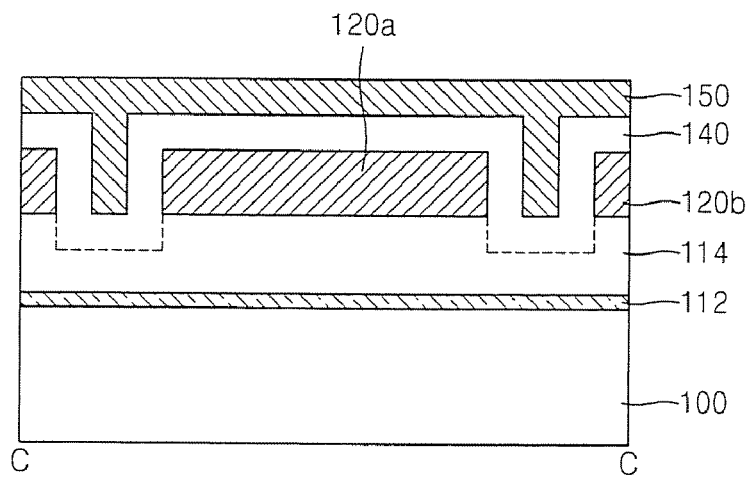
Figure 4E:
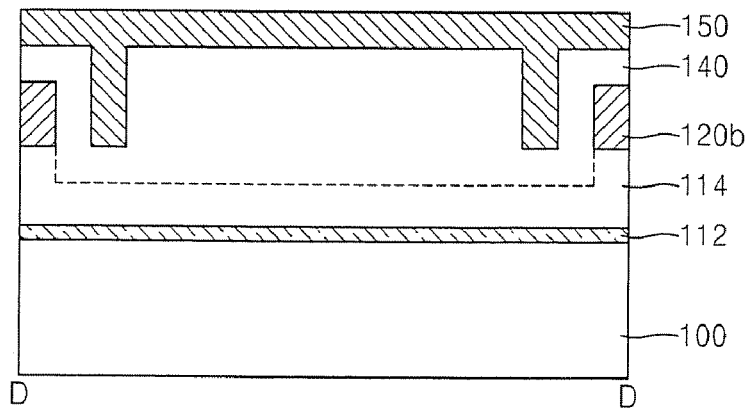

The sacrificial layer 140 is formed to a thickness approximately equal to a width of the damascene pattern to be formed. A top surface of a portion in which the sacrificial layer 140 is formed to fill the recess 113 in the etch target layer 114 may have a height approximately equal to a boundary height between the etch target layer 114 and the first mask layer pattern 120a. Referring to FIG. 3B, a gap 143 having a pitch approximately equal to the first pitch P1 is formed between the sacrificial layers 140 respectively covering the first mask layer pattern 120a that is formed to have the first pitch P1.

Referring to FIGS. 4A through 4E, a second mask layer 150 is formed to cover the gap 143 between the sacrificial layers 140. The second mask layer 150 may be formed of a material having approximately equal etch selectivity or similar etch selectivity with respect to the first mask layer 120, or may be formed of the same material for forming the first mask layer 120. For example, in the case where the first mask layer 120 is formed of a polysilicon, the second mask layer 150 may also be formed of polysilicon.

Figure 5A:
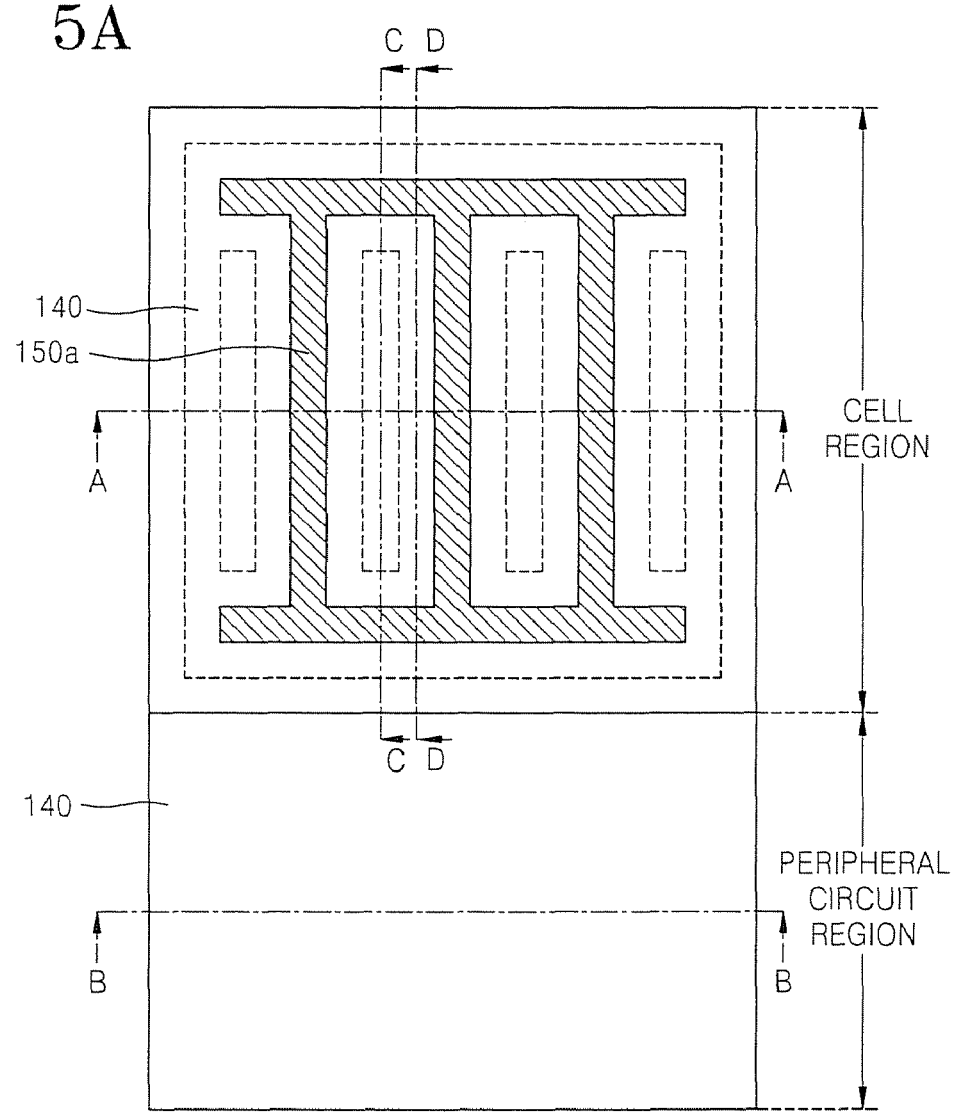
Figure 5B:
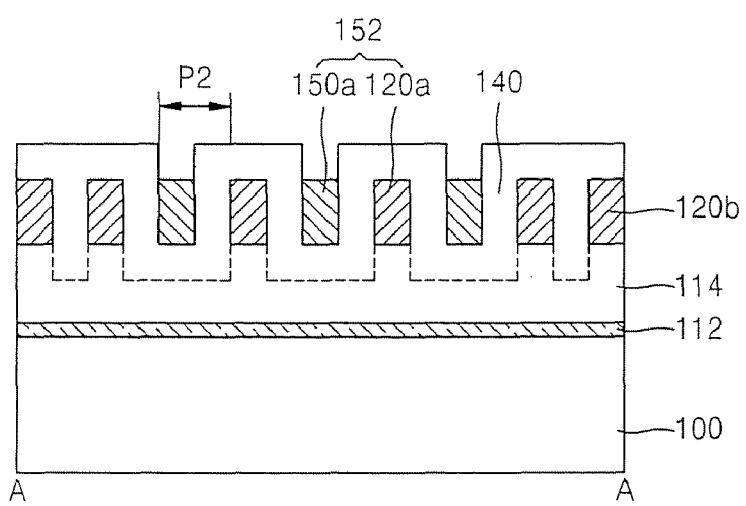
Figure 5C:
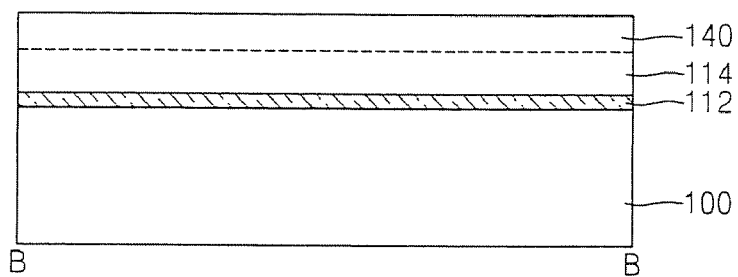
Figure 5D:
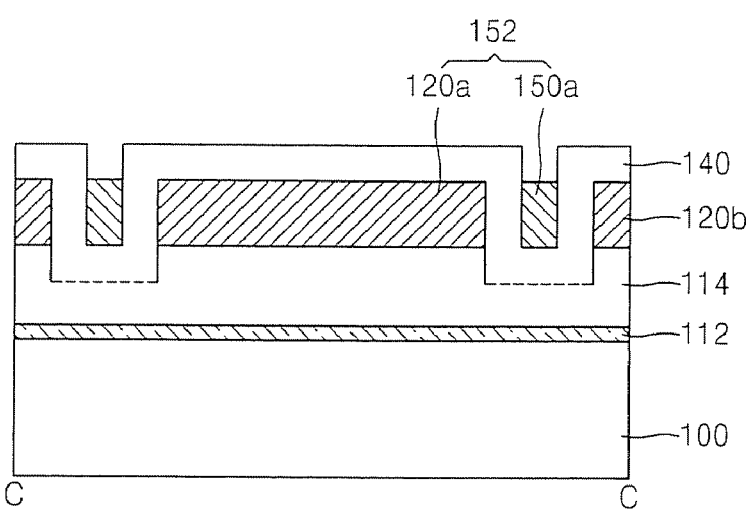
Figure 5E:
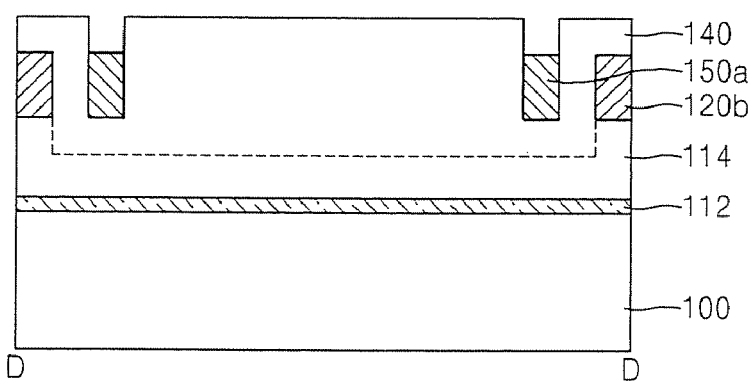
Figure 6A:
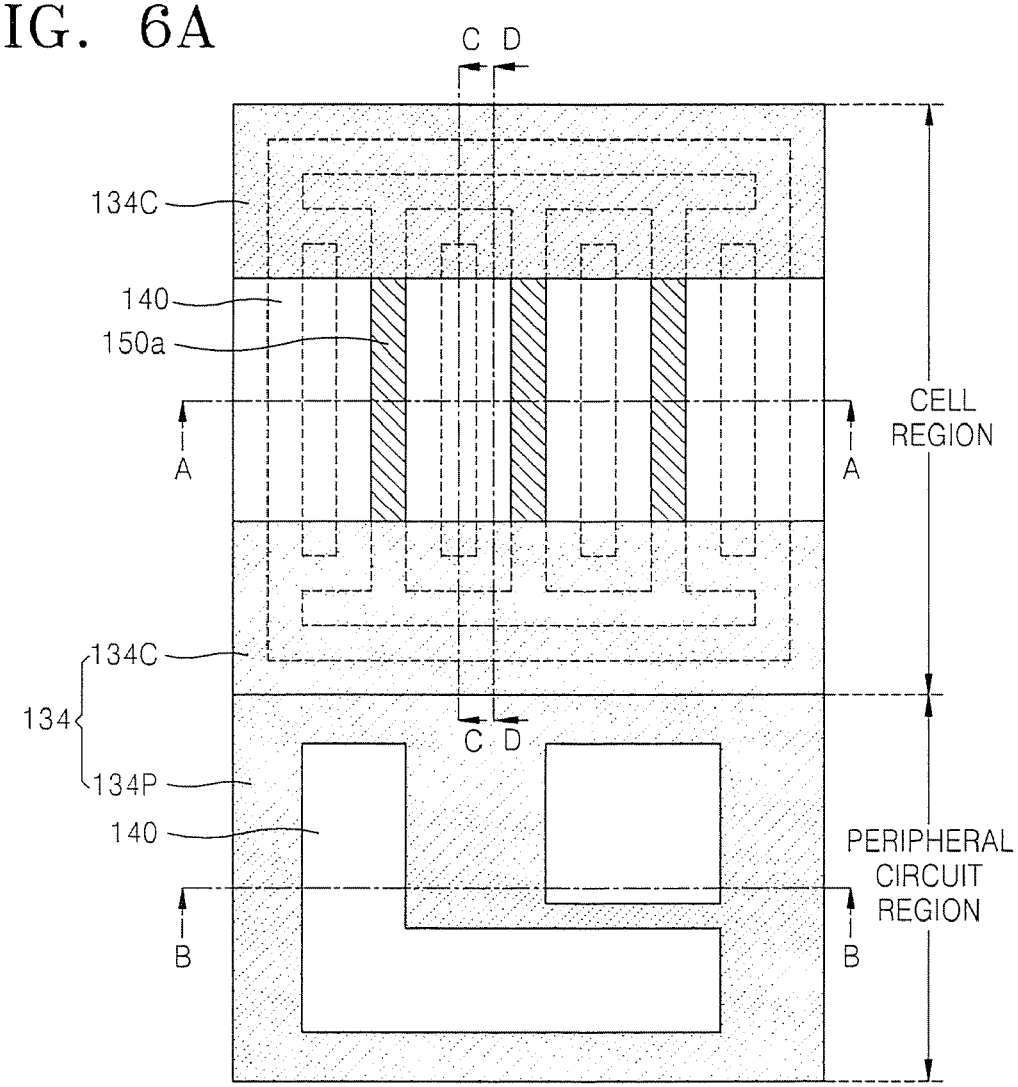
Figure 6B:
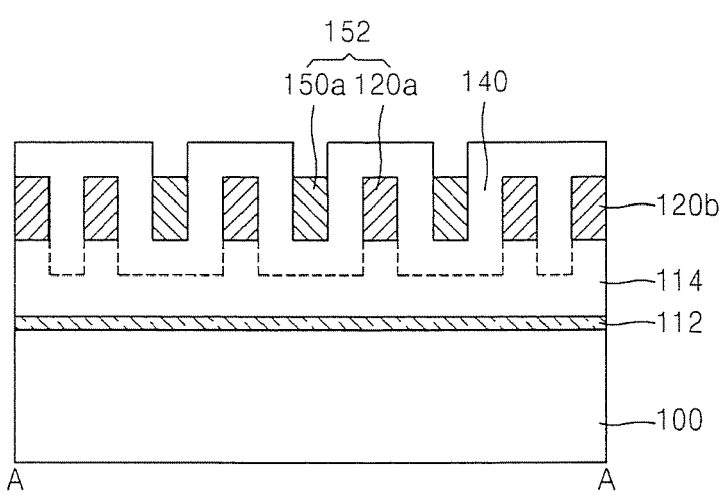
Figure 6C:
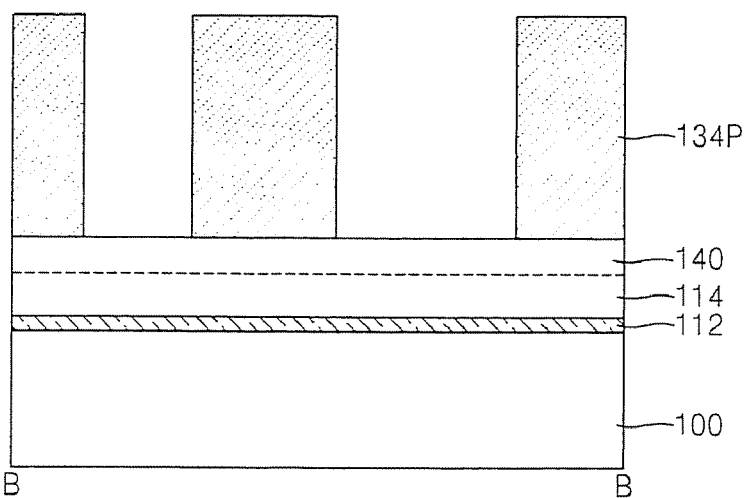
Figure 6D:
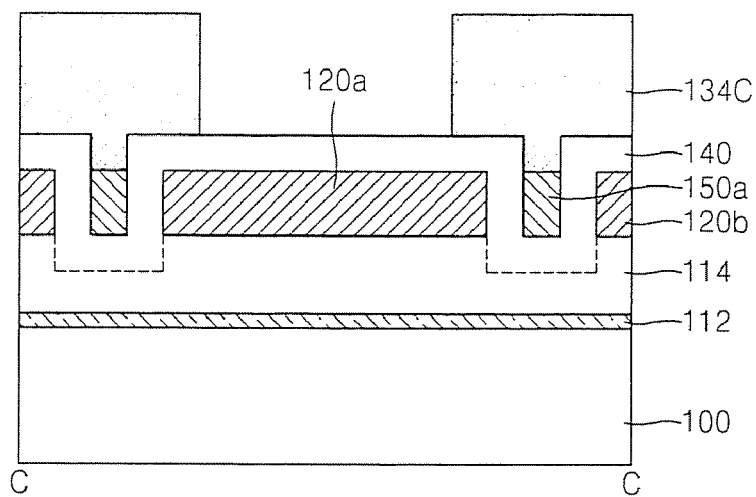
Figure 6E:
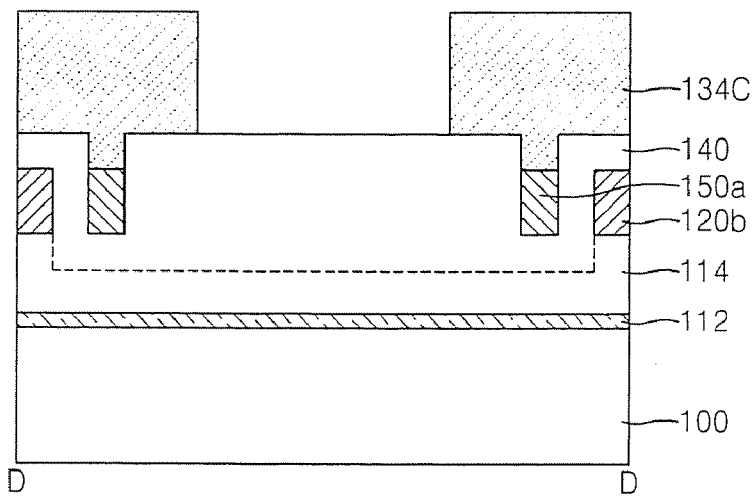
Figure 7A:
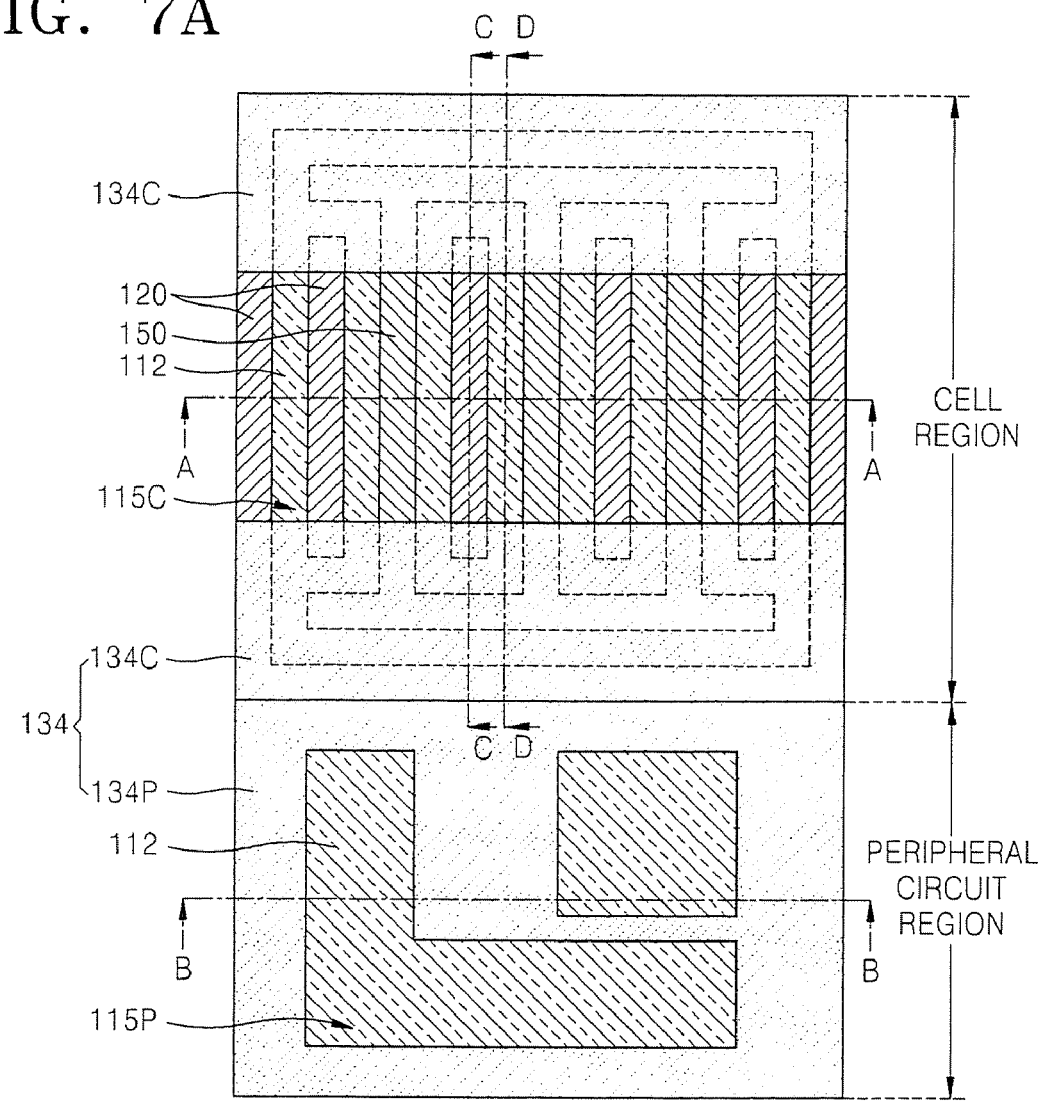
Figure 7B:
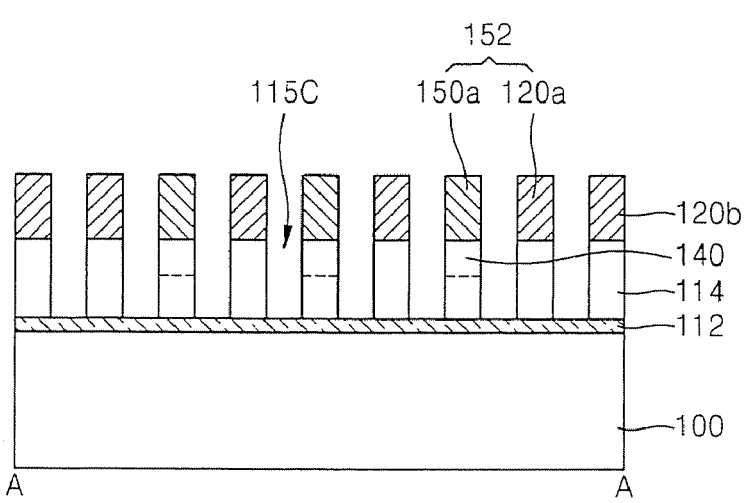

Referring to FIGS. 5A through 5E, the second mask layer 150 is etched back so as to expose a top surface of the sacrificial layer 140. The second mask layer 150 may be etched back so as to have the same height as the first mask layer pattern 120a covered by the sacrificial layer 140. By performing an etch back operation, the second mask layer 150 of the peripheral circuit region is removed, and a second mask layer pattern 150a is formed in the gap 143 between the sacrificial layers 140 of the cell region. Referring to FIG. 5B, the second mask layer pattern 150a has approximately the same pitch as the first pitch P1 of the first mask layer pattern 120a. The first mask layer pattern 120a and the second mask layer pattern 150a form a mask layer pattern 152 having a second pitch P2. The second pitch P2 is approximately half of the first pitch P1. A portion of the sacrificial layer 140 in the mask layer pattern 152 is also repeated by as much as the second pitch P2. Since the sacrificial layer 140 is formed to cover the first mask layer pattern 120a, the portions of the sacrificial layers 140 in the mask layer patterns 152 are paired up and connected to each other at both longitudinal ends of a line above the first mask layer pattern 120a.

Referring to FIGS. 6A through 6E, a second photoresist pattern 134 is formed on the semiconductor substrate 100 by using a second photomask. The second photomask defines a peripheral circuit pattern in the peripheral circuit region and a cell trimming pattern for removing the sacrificial layer 140 encircling both ends of the first mask layer pattern 120a. Thus, the second photoresist pattern 134 formed by the second photomask includes a peripheral circuit pattern 134P of the peripheral circuit region, and a cell trimming pattern 134C for covering a portion of the sacrificial layer 140 encircling both ends of the first mask layer pattern 120a in the cell region. By forming the peripheral circuit pattern 134P and the cell trimming pattern 134C using the same mask, the number of photolithography processes may be reduced so that the whole fabrication process may be simplified.

Referring to FIGS. 7A through 7E, the sacrificial layer 140 and the etch target layer 114 are etched by using the second photoresist pattern 134, the first mask layer pattern 120a, the first mask layer blocking pattern 120b and the second mask layer pattern 150a as an etch mask. In the cell region, the sacrificial layer 140, which is exposed by the cell trimming pattern 134C of the second photoresist pattern 134, is etched, and the second mask layer pattern 150a having an etch selectivity with respect to the sacrificial layer 140 is not etched. Since the first mask layer pattern 120a and the first mask layer blocking pattern 120b have an etch selectivity with respect to the sacrificial layer 140, the first mask layer pattern 120a and the first mask layer blocking pattern 120b, which are exposed by etching the sacrificial layer 140, are not etched. After the sacrificial layer 140 is etched, the etch target layer 114 is etched by using the first mask layer pattern 120a, the first mask layer blocking pattern 120b, and the second mask layer pattern 150a as an etch mask so that a damascene trench 115C is formed in the etch target layer 114 of the cell region.

In the peripheral circuit region, the sacrificial layer 140 and the etch target layer 114 are etched by using the peripheral circuit pattern 134P of the second photoresist pattern 134 as a mask so that a damascene trench 115P is formed in the etch target layer 114. The etch stopping layer 112 prevents the semiconductor substrate 100 from being etched when the etch target layer 114 is etched.

Figure 8A:
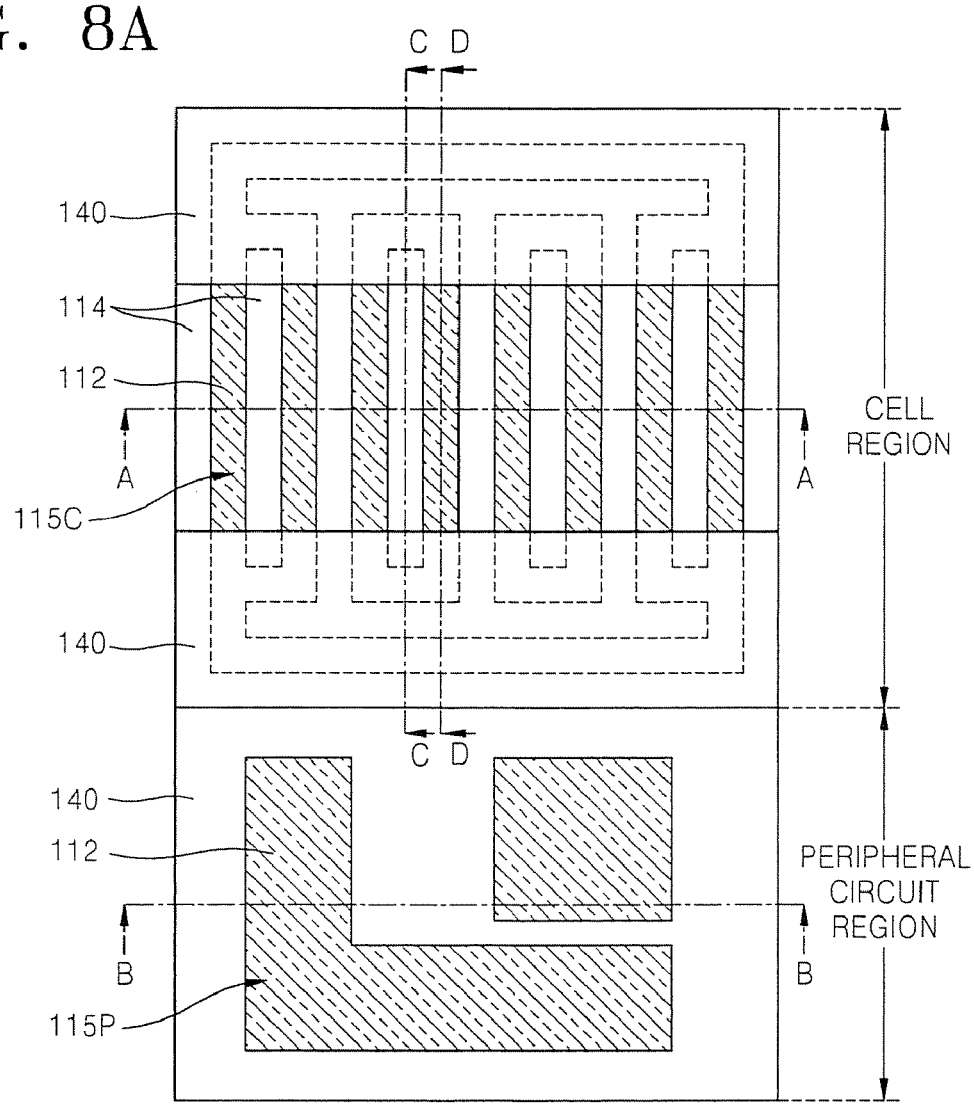
Figure 8B:
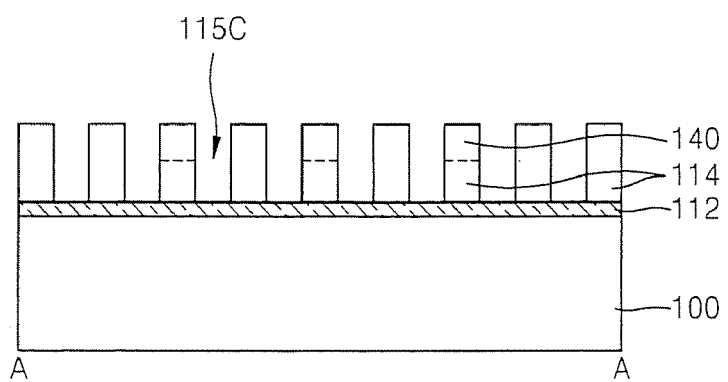
Figure 8C:
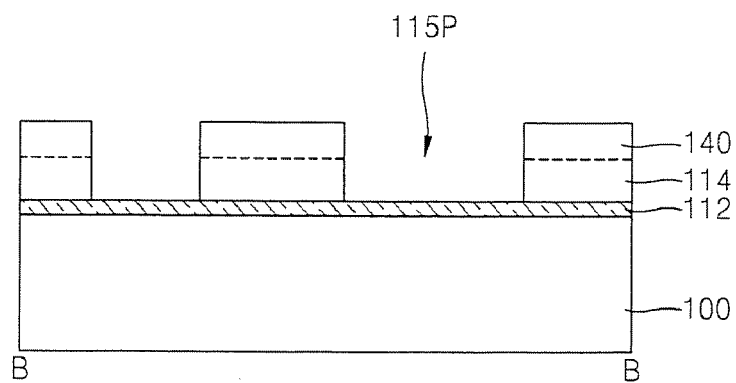
Figure 8D:
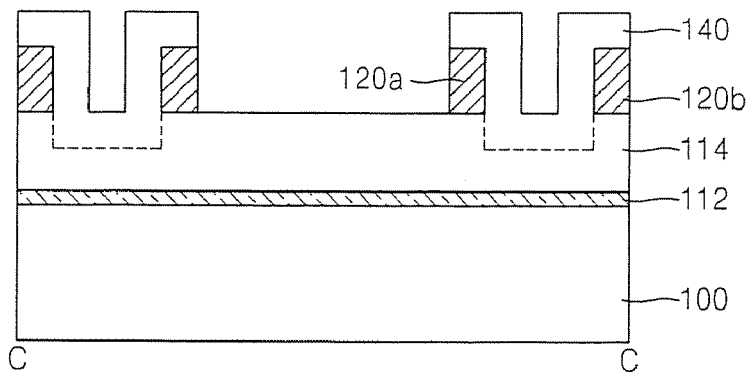
Figure 8E:
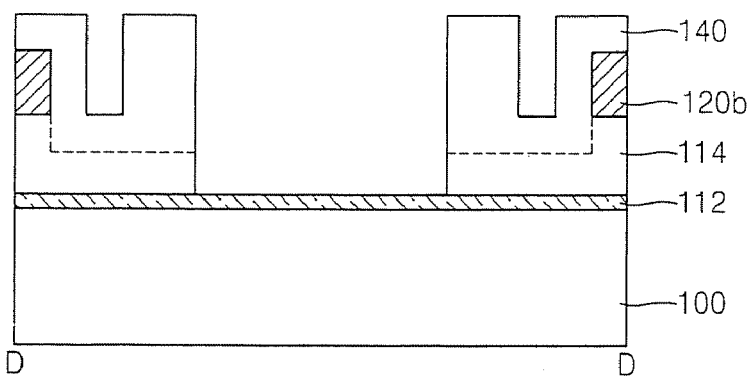
Figure 9A:
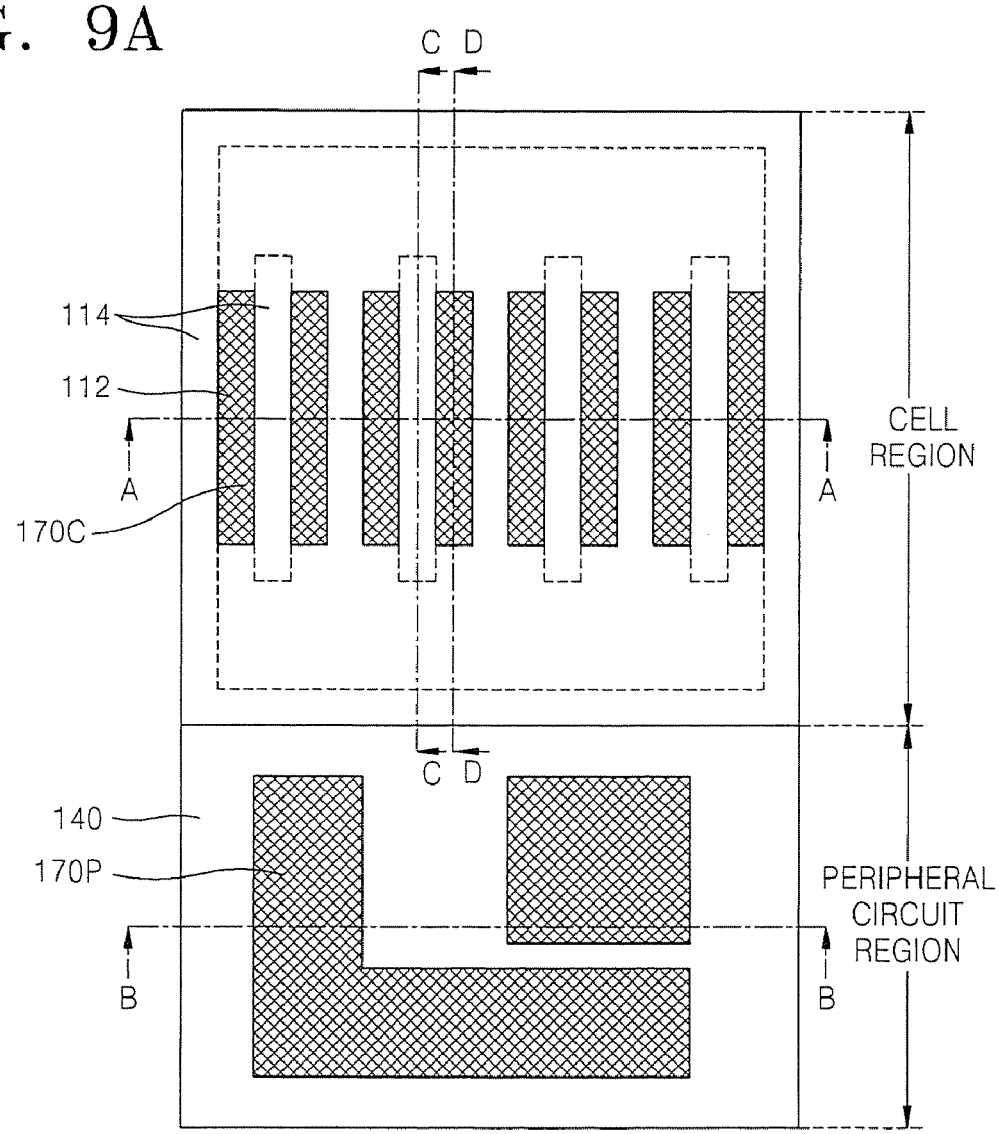
Figure 9B:
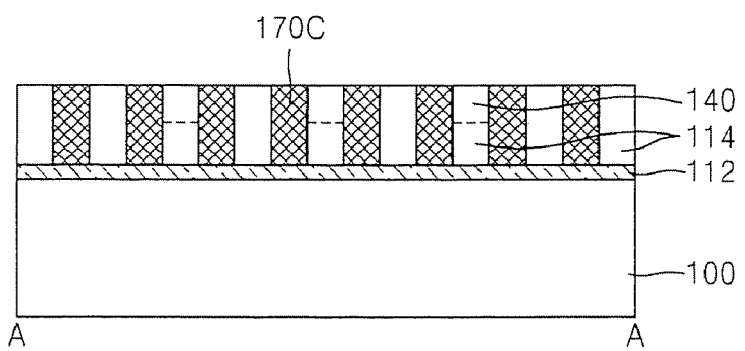
Figure 9C:
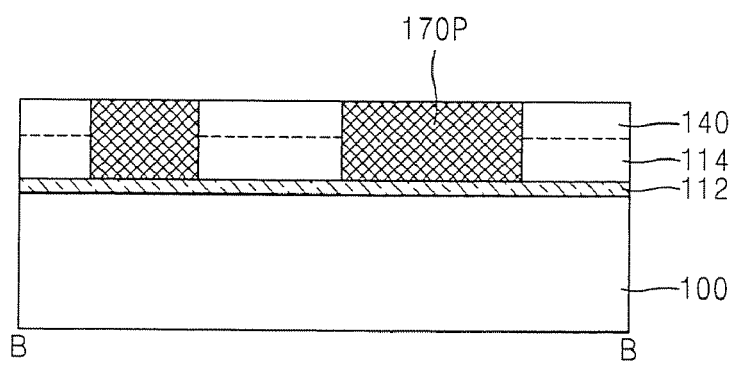
Figure 9D:
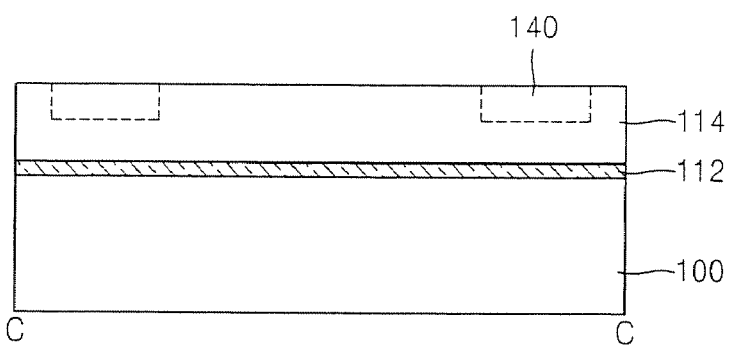
Figure 9E:
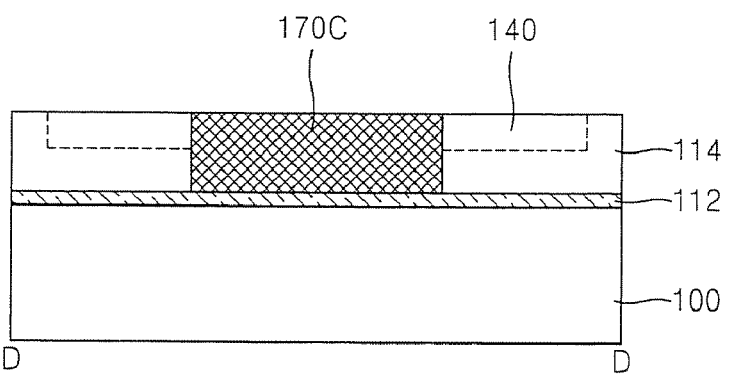
Figure 10A:
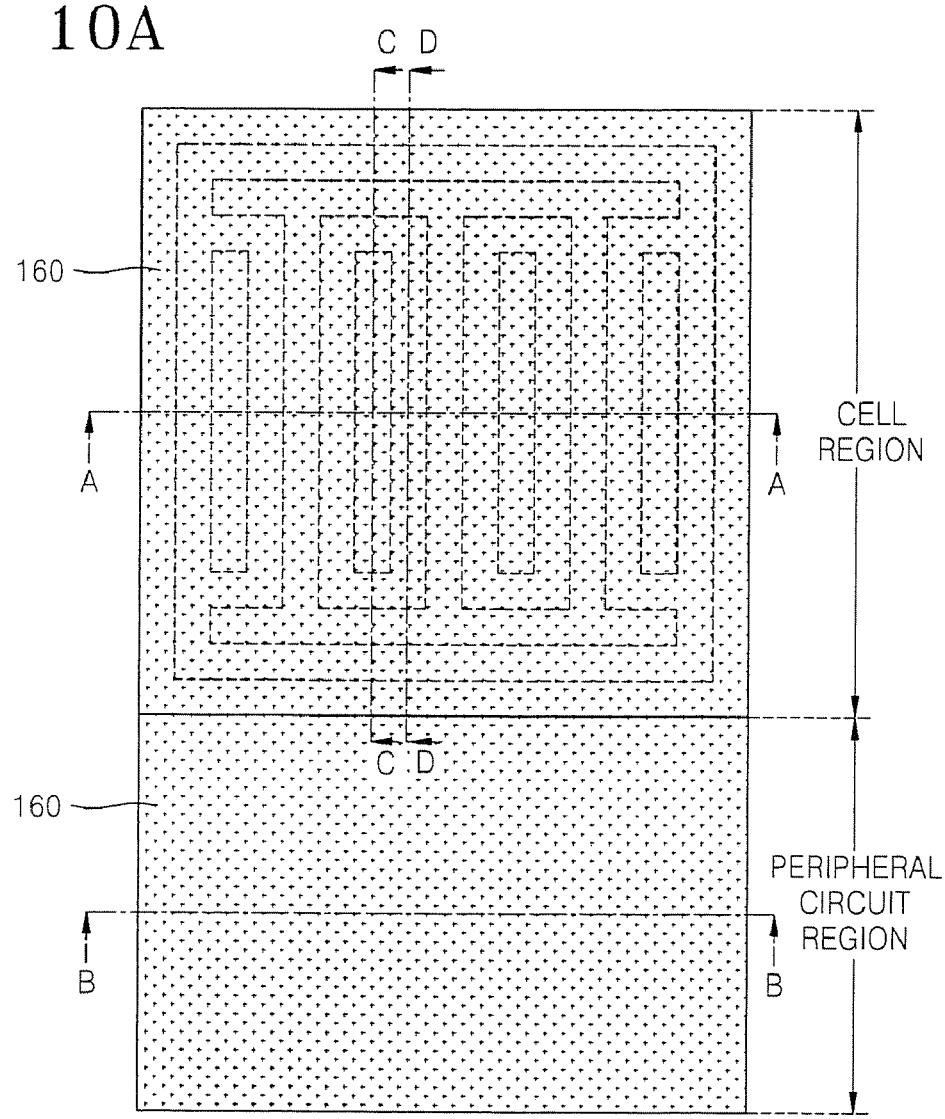
FIGS. 10A, 11A, 12A, and 13A are plane views illustrating a fabrication process for a semiconductor device according to some embodiments of the present invention.
Figure 10B:
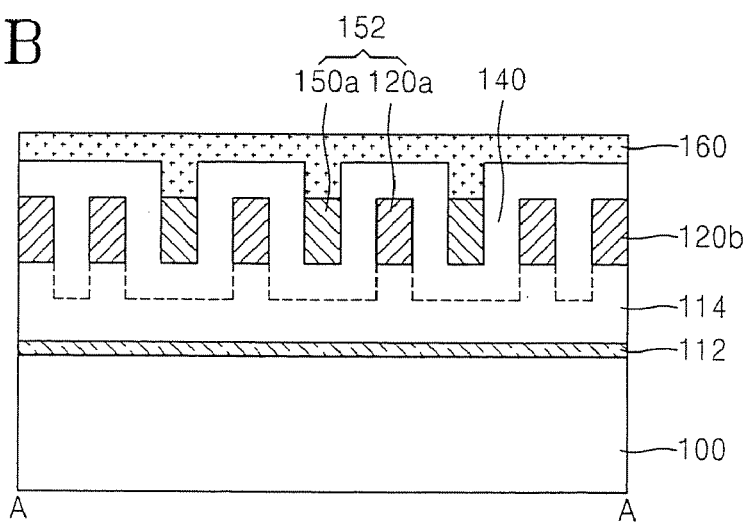
FIGS. 10B, 11B, 12B, and 13B are cross-sectional views respectively taken along lines A-A of FIGS. 10A, 11A, 12A, and 13A.
Figure 10C:
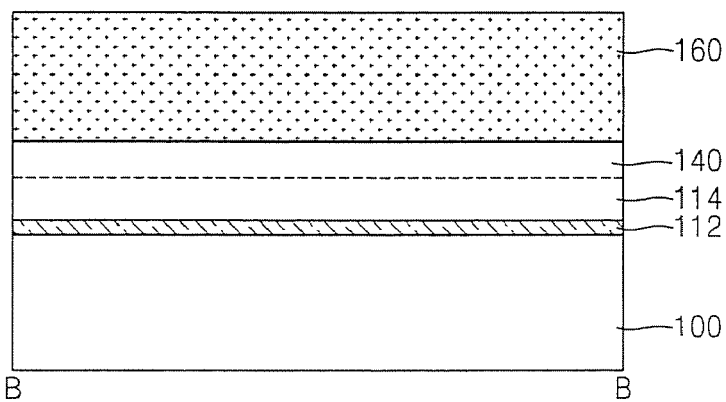
FIGS. 10C, 11C, 12C, and 13C are cross-sectional views respectively taken along lines B-B of FIGS. 10A, 11A, 12A, and 13A.
Figure 10D:
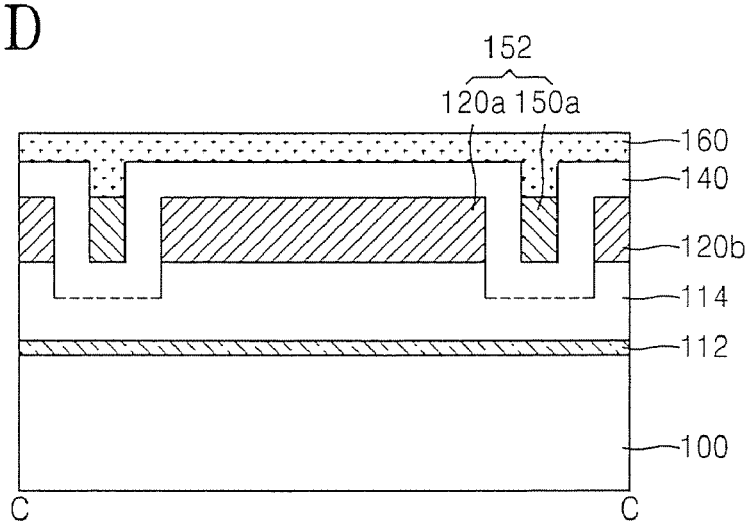
FIGS. 10D, 11D, 12D, and 13D are cross-sectional views respectively taken along lines C-C of FIGS. 10A, 11A, 12A, and 13A.
Figure 10E:
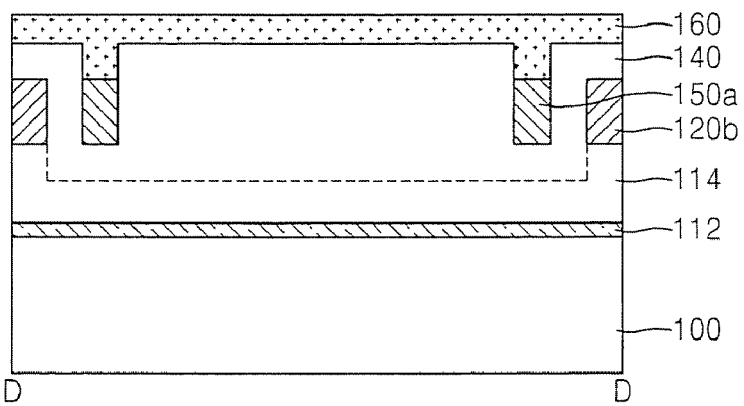
FIGS. 10E, 11E, 12E, and 13E are cross-sectional views respectively taken along lines D-D of FIGS. 10A, 11A, 12A, and 13A.
Figure 11A:
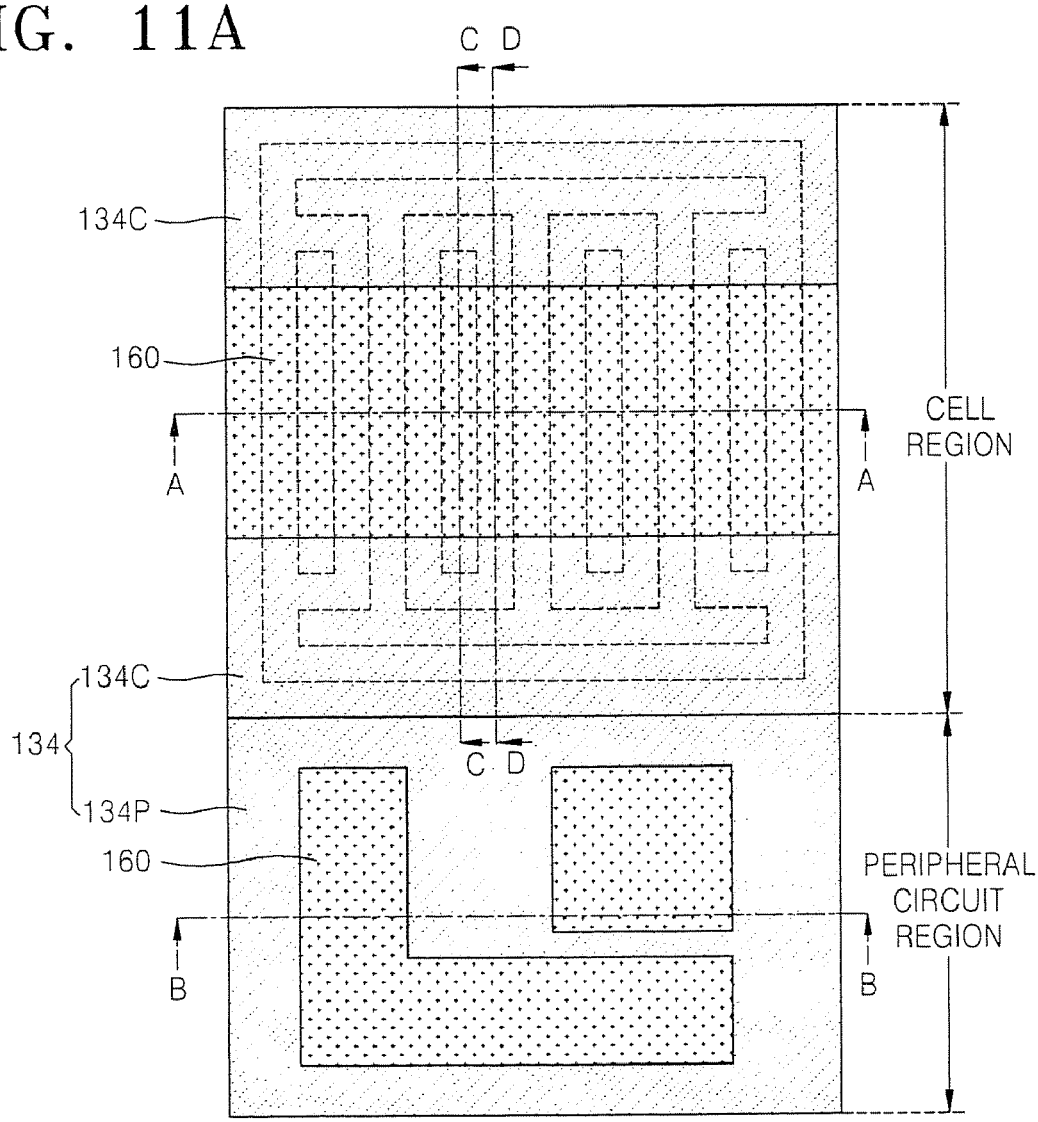
Figure 11B:
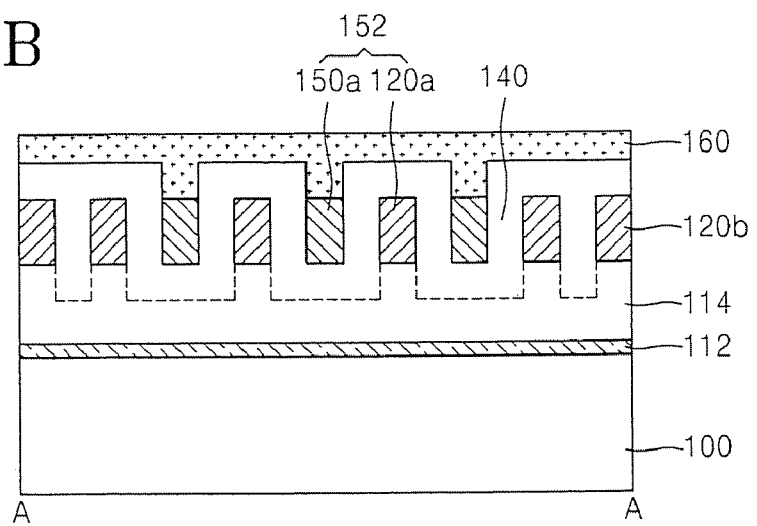
Figure 11C:
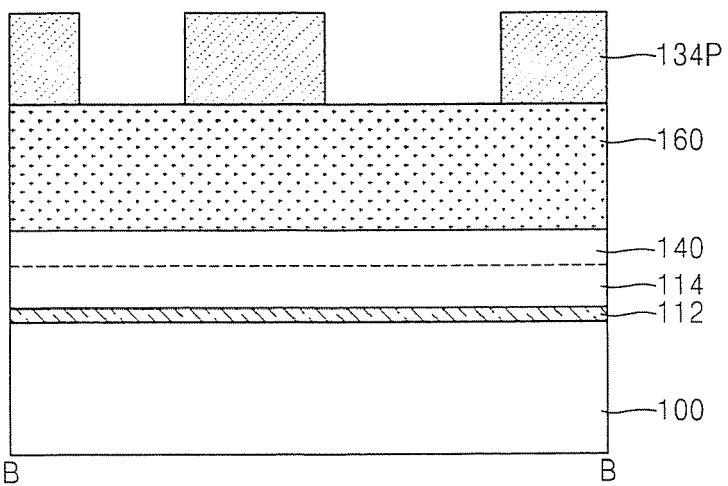
Figure 11D:
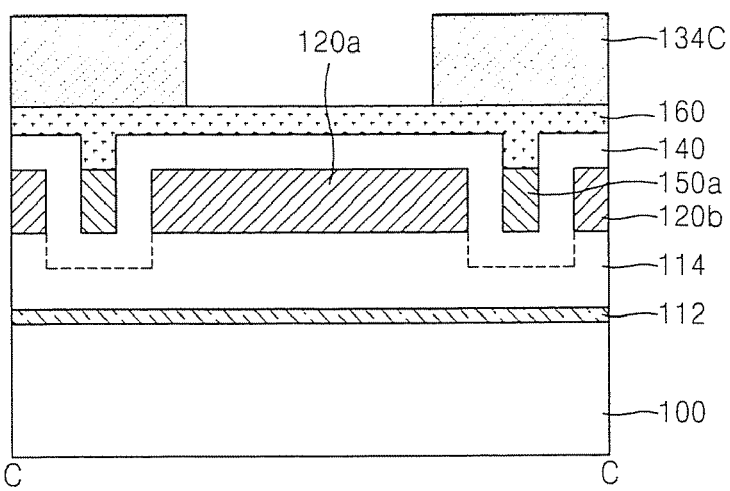
Figure 11E:
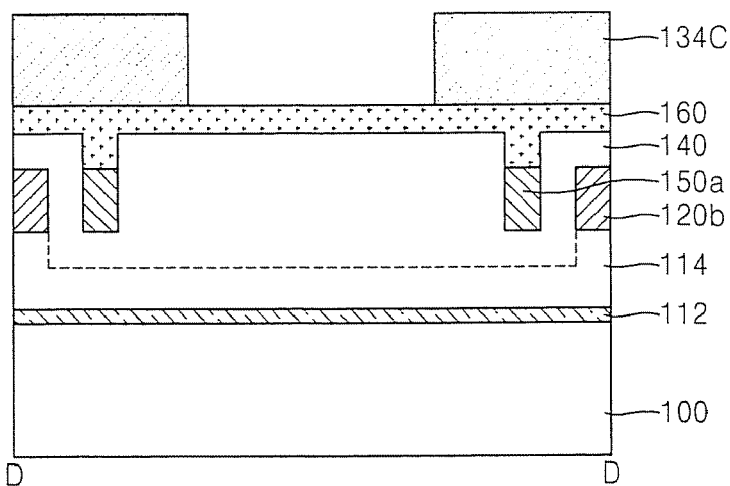
Figure 12A:
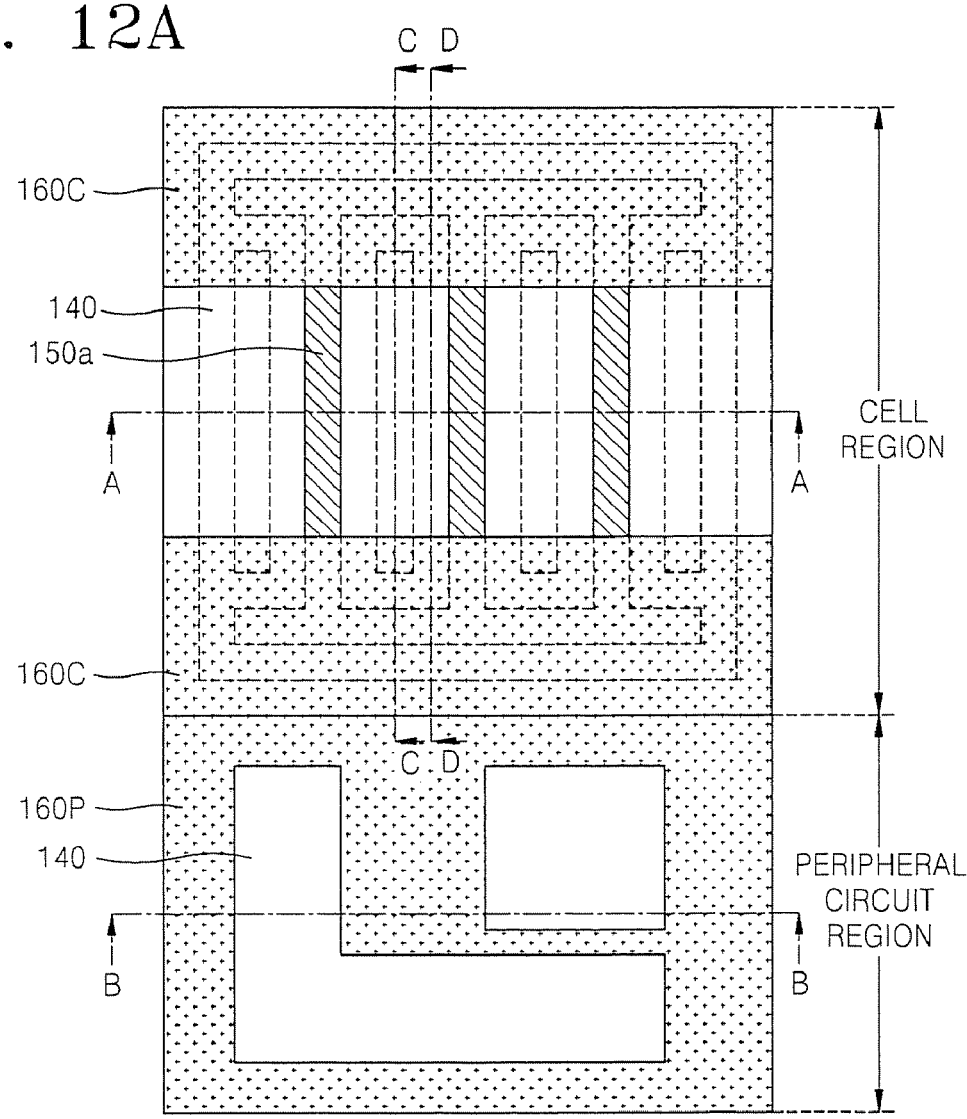
Figure 12B:
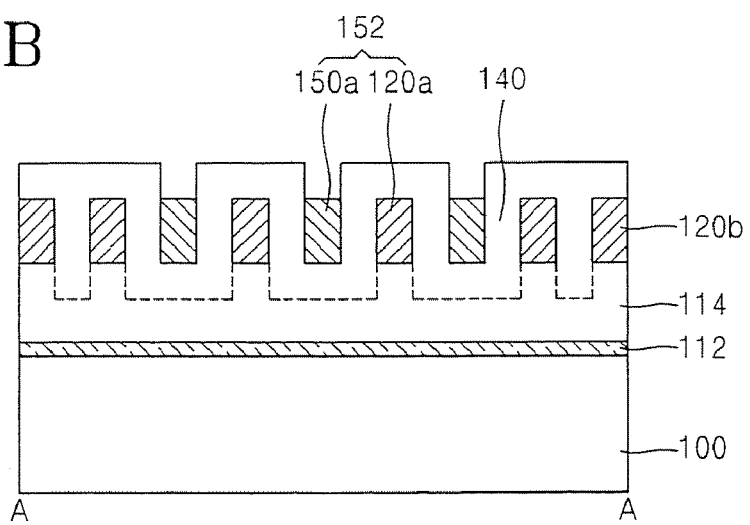
Figure 12C:
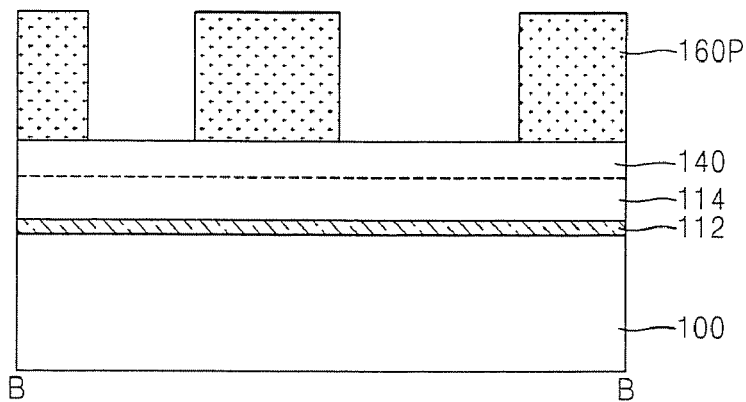
Figure 12D:
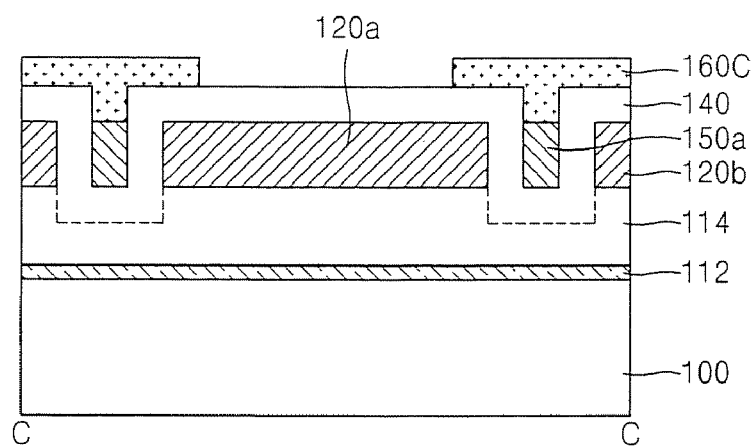
Figure 12E:
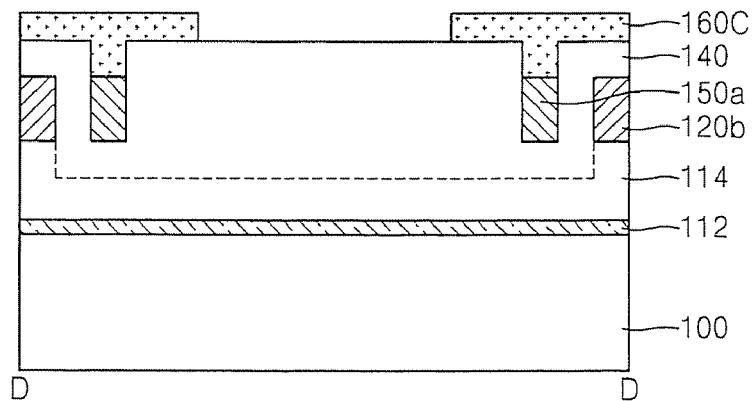
Figure 13A:
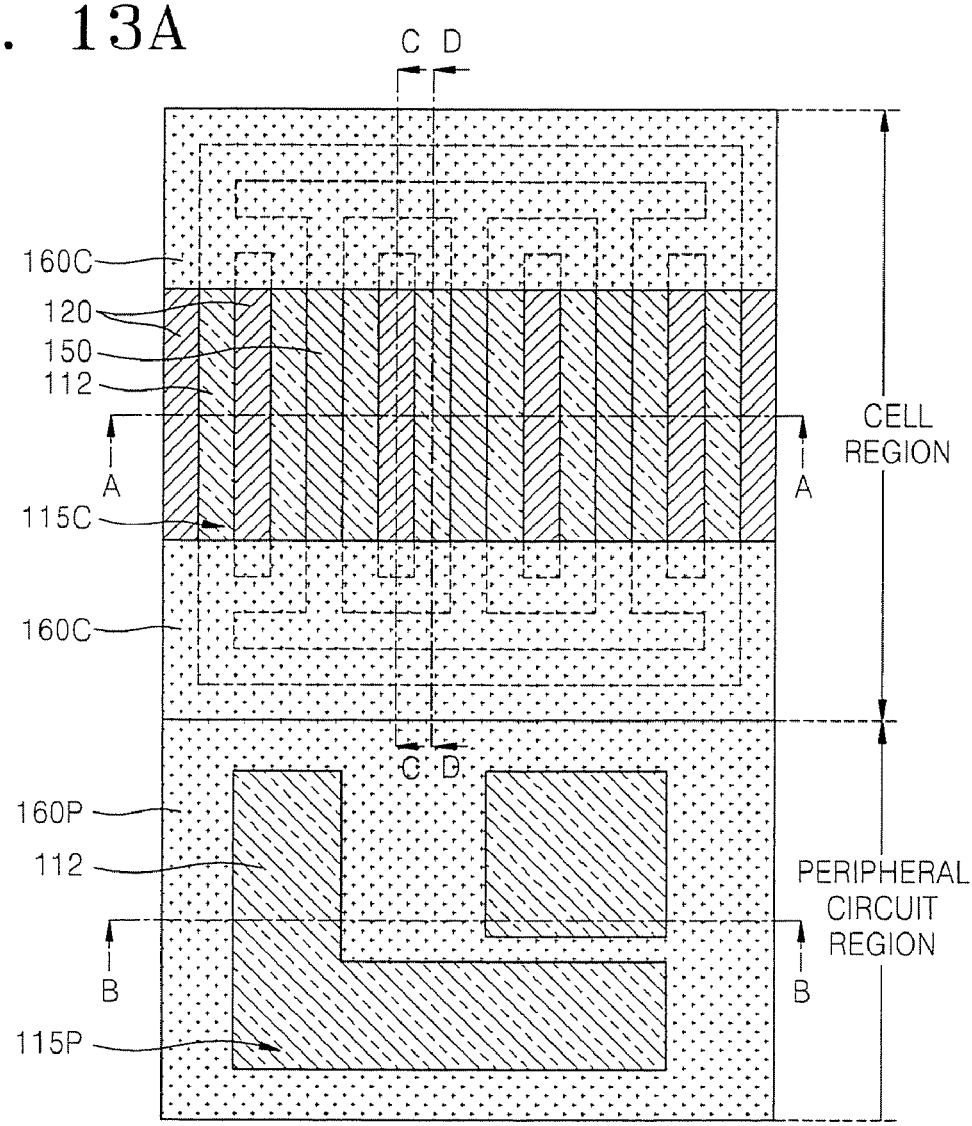
Figure 13B:
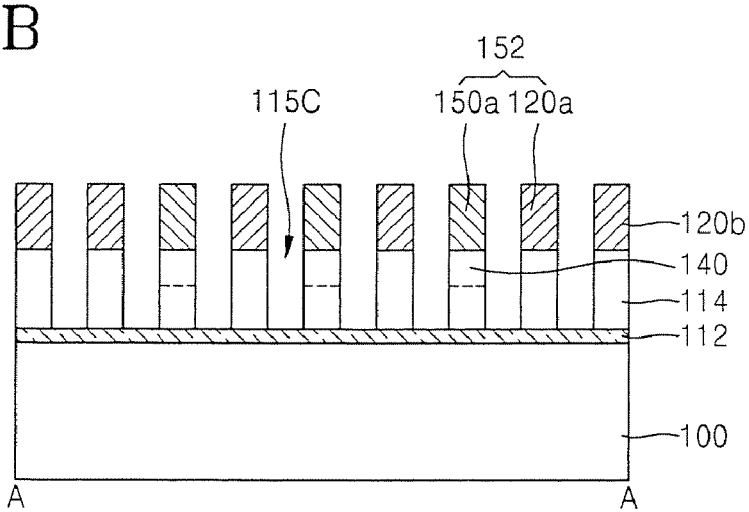
Figure 13C:
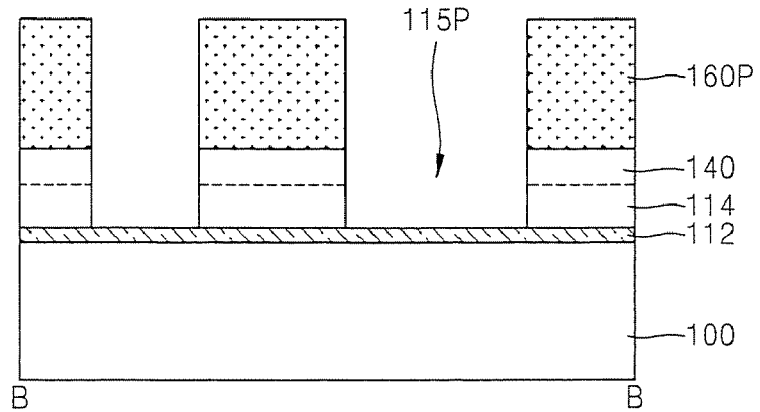
Figure 13D:
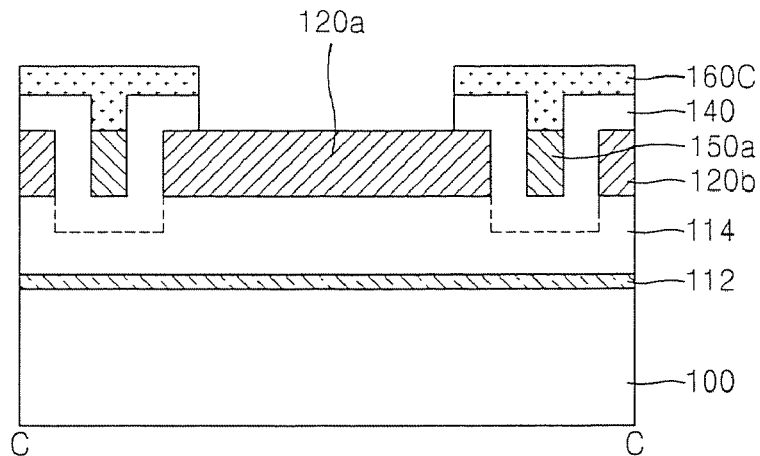
Figure 13E:
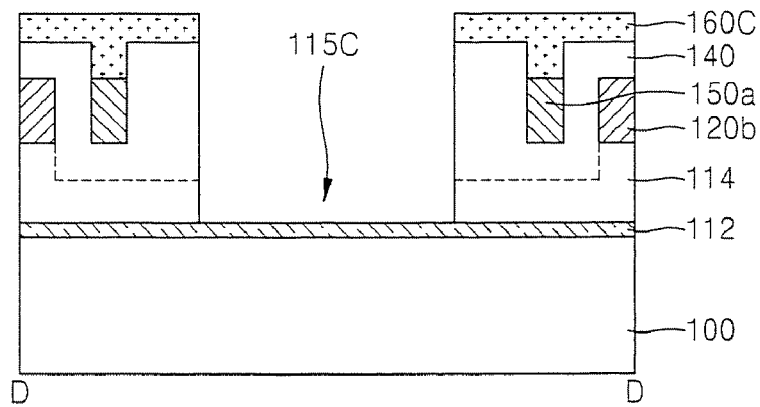

Referring to FIGS. 8A through 8E, the second photoresist pattern 134, the exposed second mask layer pattern 150a, and the first mask layer pattern 120a are sequentially removed. As illustrated in FIGS. 8A, 8D, and 8E, trenches are not formed in the etch target layer 114 since the sacrificial layer 140 remains in portions of the cell region in which the cell trimming pattern 134C was formed, and thus, both ends of two adjacent damascene trenches 115C are divided.

Referring to FIGS. 9A through 9E, a conductive layer 170 is formed above the surface of the semiconductor substrate 100 so as to cover the damascene trench 115C of the cell region and the damascene trench 115P of the peripheral circuit region, and then a Chemical Mechanical Polishing (CMP) operation is performed on the conductive layer 170 so as to expose the etch target layer 114 so that a damascene pattern 170C of the cell region and a damascene pattern 170P of the peripheral circuit region are formed. The conductive layer 170 may be a copper layer. The copper layer may be formed by performing an electroplating operation on a seed copper layer that is formed by sputtering. The copper layer may be formed on a barrier layer (not shown), such as a Ti or Ta layer. Also, the damascene pattern 170C and the damascene pattern 170P may be formed as another conductive layer as well as the copper layer. The sacrificial layer 140 and the first mask layer blocking pattern 120b existing below the cell trimming pattern 134C are also removed when the CMP operation is performed on the conductive layer 170 so that a top surface of the semiconductor substrate 100, in which the damascene pattern 170C and the damascene pattern 170P are formed, may be planarized. When the conductive layer 170 is a copper layer, the barrier (not shown) may function as a CMP stopping layer.

According to some embodiments of the present invention, a width of the damascene trench 115C of the cell region is determined by a width of the sacrificial layer 140 in the mask layer patterns 152. Since the sacrificial layer 140 remains at a deposition state, a deposition thickness of the sacrificial layer 140 substantially corresponds to the width of the sacrificial layer 140. Thus, by adjusting the deposition thickness of the sacrificial layer 140, a minute width of the damascene trench 115C of the cell region may be formed in a uniform manner. By forming the width of the damascene trench 115C in a uniform manner, a conductive layer such as a copper layer may be easily formed in the damascene trench 115C. Also, a cell trimming pattern of the cell region is formed when a pattern of the peripheral circuit region is formed so that the number of photolithography processes may be reduced, and the fabrication process may be simplified.

FIGS. 10A, 11A, 12A, and 13A are plane views orderly illustrating a fabrication process for describing a method of forming a pattern of a semiconductor device according to some embodiments of the present invention. FIGS. 10B, 11B, 12B, and 13B are cross-sectional views respectively taken along a line A-A of FIGS. 10A, 11A, 12A, and 13A. FIGS. 10C, 11C, 12C, and 13C are cross-sectional views respectively taken along a line B-B of FIGS. 10A, 11A, 12A, and 13A. FIGS. 10D, 11D, 12D, and 13D are cross-sectional views respectively taken along a line C-C of FIGS. 10A, 11A, 12A, and 13A. FIGS. 10E, 11E, 12E, and 13E are cross-sectional views respectively taken along a line D-D of FIGS. 10A, 11A, 12A, and 13A.

The embodiments of FIGS. 10A, 11A, 12A, and 13A are different from the previous embodiments of FIGS. 1A through 9E in that, after a mask layer pattern 152 is formed, a planarization mask layer 160 is used before a second photoresist pattern 134 is formed by using a second photomask according to the present embodiment of FIGS. 10A, 11A, 12A, and 13A. Operations with respect to forming the mask layer pattern 152 in a cell region are the same as those previously described with reference to FIGS. 1A through 5E.

Referring to FIGS. 10A through 10E, the planarization mask layer 160 is formed on a semiconductor substrate 100 in which the mask layer pattern 152 is formed in the cell region of the semiconductor substrate 100. The planarization mask layer 160 may be formed using a spin coating method so as to be a spin on hardmask (SOH) layer or a spin on glass (SOG), which may have a better planarization characteristic. The planarization mask layer 160 may function to remove a step coverage which is caused due to the mask layer pattern 152 formed only in the cell region and not in a peripheral circuit region, and which occurs between the cell region and the peripheral circuit region, and to perform planarization on the cell region and the peripheral circuit region.

Referring to FIGS. 11A through 11E, a second photoresist pattern 134 is formed on the planarization mask layer 160 by using a second photomask. The second photoresist pattern 134 includes a peripheral circuit pattern 134P in the peripheral circuit region, and a cell trimming pattern 134C for removing a portion of a sacrificial layer 140 encircling both ends of a first mask layer pattern 120a in the cell region.

Referring to FIGS. 12A through 12E, the planarization mask layer 160 is etched by using the second photoresist pattern 134 as a mask so that planarization mask layer patterns 160C and 160P are formed. The planarization mask layer patterns 160C and 160P include a cell trimming pattern 160C and a peripheral circuit pattern 160P in the peripheral circuit region, as the second photoresist pattern 134 includes a peripheral circuit pattern 134P in the peripheral circuit region, and a cell trimming pattern 134C.

Referring to FIGS. 13A through 13E, the sacrificial layer 140 and an etch target layer 114 are etched by using the planarization mask layer patterns 160C and 160P, the first mask layer pattern 120a, a first mask layer blocking pattern 120b and a second mask layer pattern 150a as an etch mask. In the cell region, the sacrificial layer 140, which is exposed by the planarization mask layer pattern 160C, is first etched, and the second mask layer pattern 150a having an etch selectivity with respect to the sacrificial layer 140 is not etched. Since the first mask layer pattern 120a and the first mask layer blocking pattern 120b have an etch selectivity with respect to the sacrificial layer 140, the first mask layer pattern 120a and the first mask layer blocking pattern 120b, which are exposed due to that the sacrificial layer 140 is etched, are not etched. After the sacrificial layer 140 is etched, the etch target layer 114 is etched by using the first mask layer pattern 120a, the first mask layer blocking pattern 120b, and the second mask layer pattern 150a as an etch mask so that a damascene trench 115C is formed in the etch target layer 114 of the cell region.

In the peripheral circuit region, the sacrificial layer 140 and the etch target layer 114 are etched by using the planarization mask layer pattern 160P as a mask so that a damascene trench 115P is formed in the etch target layer 114. An etch stopping layer 112 prevents the semiconductor substrate 100 from being etched when the etch target layer 114 is etched.

After that, the planarization mask layer patterns 160C and 160P, the second mask layer pattern 150a, the first mask layer pattern 120a, and the first mask layer blocking pattern 120b are sequentially removed so that the damascene trench 115C is formed in the cell region and the damascene trench 115P is formed in the peripheral circuit region, as illustrated in FIGS. 13A through 13E. Due to the sacrificial layer 140 that is not removed by the cell trimming pattern 134C, two adjacent damascene trenches 115C, which are formed by using the first mask layer pattern 120a as a mold, are separated from each other.

Operations for forming damascene patterns 170C and 170P in the damascene trenches 115C and 115P are the same as those previously described with reference to FIGS. 9A through 9E.

According to the embodiments of FIGS. 10A, 11A, 12A, and 13A, after the mask layer pattern 152 of the cell region is formed, the planarization mask layer 160 having a better planarization characteristic is used in a photolithography process for forming a peripheral circuit pattern and a cell trimming pattern so that a step coverage between the cell region and the peripheral circuit may be removed, and a depth of focus (DOF) margin in the photolithography process may be obtained.

Figure 14A:
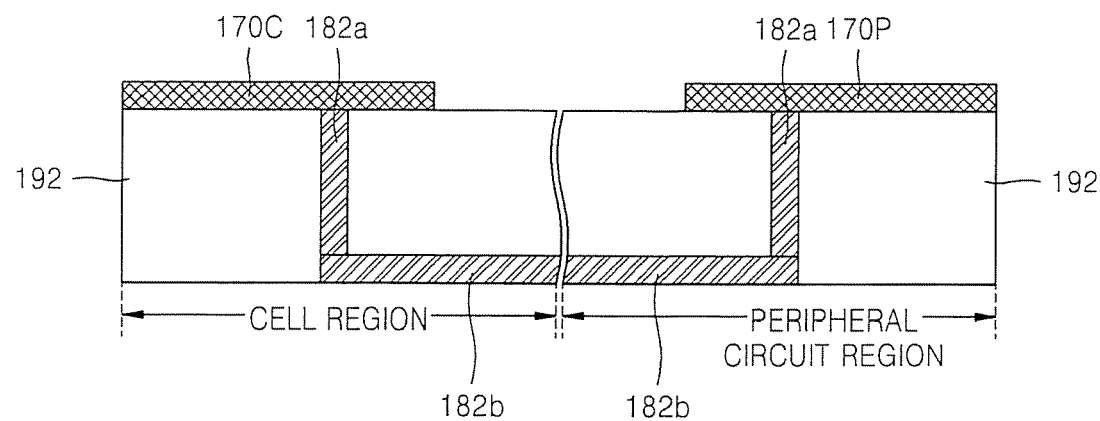
FIGS. 14A and 14B are cross-sectional views of a semiconductor device according to some embodiments of the present invention.
Figure 14B:
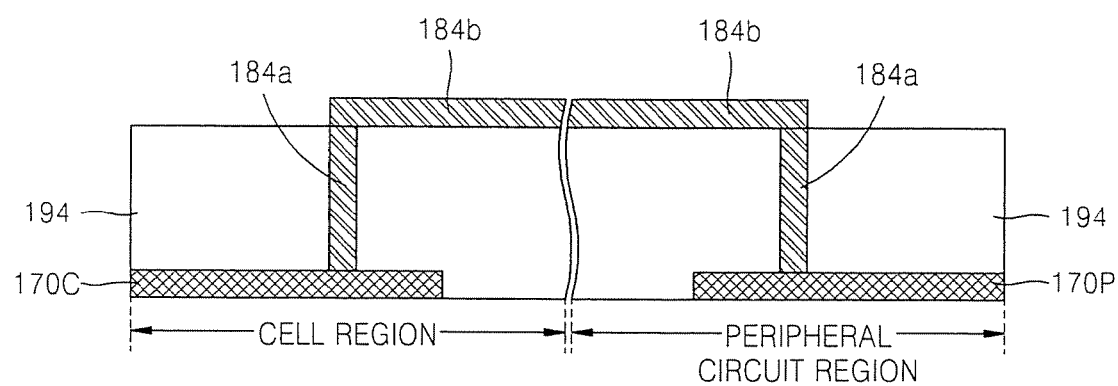

Referring to FIGS. 14A and 14B, the damascene pattern 170C of the cell region and the damascene pattern 170P of the peripheral circuit region are formed to be separated from each other. The separated damascene patterns 170C and 170P may be electrically cross-connected via connecting contacts 182a and 184a and connecting lines 182b and 184b, which are formed in a lower interlayer dielectric layer 192 or an upper interlayer dielectric layer 194.

The embodiments of the present invention are described with reference to the cell region and the peripheral circuit region. However, regardless of names or functions, the embodiments of the present invention may be applied to a semiconductor device having a region in which minute damascene patterns are formed using a double patterning technology and a region in which various damascene patterns are formed without using the double patterning technology.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of forming a semiconductor device pattern, comprising:
    forming a first mask layer pattern comprising a plurality of parallel line portions on an etch target layer on a semiconductor substrate;
    forming recesses in the etch target layer between the parallel line portions of the first mask layer pattern;
    forming a sacrificial layer on the first mask layer pattern and in the recesses between the parallel line portions of the first mask layer pattern;
    forming a second mask layer pattern on the sacrificial layer, the second mask layer pattern comprising respective parallel lines disposed between respective adjacent ones of the parallel line portions of the first mask layer pattern, wherein adjacent line portions of the first mask layer pattern and the second mask layer pattern are separated by the sacrificial layer;
    forming a third mask layer pattern comprising first and second portions covering respective first and second ends of the line portions of the first mask layer pattern and the second mask layer pattern and having an opening at the line portions of the first and second mask layer patterns between the first and second ends; and
    etching the sacrificial layer and the etch target layer using the third mask layer pattern, the first mask layer pattern and the second mask layer pattern as a mask to thereby form a plurality of parallel trenches in the etch target layer between the line portions of the first and second mask layer patterns.

2. The method of claim 1, wherein the third mask layer pattern further comprises a third portion having an opening at a peripheral circuit region, and wherein etching the sacrificial layer and the etch target layer using the third mask layer pattern, the first mask layer pattern and the second mask layer pattern as a mask to thereby form a plurality of parallel trenches in the etch target layer between the line portions of the first and second mask layer patterns comprises forming a trench in the peripheral circuit region.

3. The method of claim 1, wherein the etch target layer comprises an insulating layer.

4. The method of claim 1, wherein the sacrificial layer comprises the same material as the etch target layer.

5. The method of claim 1, wherein the first mask layer pattern and the second mask layer pattern comprise the same material.

6. The method of claim 5, wherein the first mask layer pattern and the second mask layer pattern each comprise polysilicon.

7. The method of claim 1, wherein forming a second mask layer pattern comprises:
forming a mask layer on the sacrificial layer and filling recesses in the sacrificial layer between the line portions of the first mask layer patterns; and
etching back the mask layer to expose the sacrificial layer and form the second mask layer pattern.

8. The method of claim 7, wherein etching back the mask layer comprises etching bask the mask layer to form a second mask pattern with a thickness approximately equal to a thickness of the first mask layer pattern.

9. The method of claim 1, wherein etching the sacrificial layer and the etch target layer using the third mask layer pattern, the first mask layer pattern and the second mask layer pattern as a mask to thereby form a plurality of parallel trenches in the etch target layer between the line portions of the first and second mask layer patterns comprises:
selectively etching the sacrificial layer using the third mask layer pattern as a mask to expose the etch target layer; and
etching the etch target layer using the first mask layer pattern and the second mask layer pattern as a mask to form the parallel trenches.

10. The method of claim 1, further comprising:
removing the third mask layer pattern; and
removing the first mask layer pattern and the second mask layer pattern.

11. The method of claim 10, further comprising:
forming a conductive layer filling the parallel trenches; and
chemical mechanical polishing the conductive layer to expose the etch target layer and form parallel conductive lines in the parallel trenches.

12. The method of claim 11, wherein the conductive layer comprises a copper layer.

13. The method of claim 1, wherein each parallel line portion of the first mask layer pattern and each parallel line of the second mask layer pattern are arranged alternatively.

14. The method of claim 1, wherein the parallel lines of the second mask layer pattern has the same pitch as that of the parallel line portions of the first mask layer pattern.

15. A method of forming a semiconductor device pattern, comprising:
forming an etch target layer on a semiconductor substrate comprising a first region and a second region;
forming a first mask layer pattern comprising a plurality of parallel line portions on the etch target layer in the first region;
forming recesses in the etch target layer between the parallel line portions of the first mask layer pattern;
forming a sacrificial layer having a uniform thickness on the first mask layer pattern and in the recesses in the etch target layer between the parallel line portions of the first mask layer pattern;
forming a second mask layer pattern on the sacrificial layer, the second mask layer pattern comprising respective parallel line portions disposed between respective adjacent ones of the parallel line portions of the first mask layer pattern in the first region, wherein adjacent line portions of the first mask layer pattern and the second mask layer pattern are separated by the sacrificial layer;
forming a third mask layer pattern comprising first and second portions covering respective first and second ends of the line portions of the first mask layer pattern and the second mask layer pattern and having an opening at the line portions of the first and second mask layer patterns between the first and second ends in the first region and a third portion having an opening in the second region; and
etching the sacrificial layer and the etch target layer using the third mask layer pattern, the first mask layer pattern and the second mask layer pattern as a mask to thereby form a plurality of parallel first trenches in the etch target layer between the line portions of the first and second mask layer patterns in the first region and a second trench in the second region.

16. The method of claim 15, wherein the etch target layer comprises an insulating layer.

17. The method of claim 15, further comprising:
removing the third mask layer pattern;
removing the first mask layer pattern and the second mask layer pattern;
forming a conductive layer filling the first trenches; and
chemical mechanical polishing the conductive layer to expose the etch target layer and form a plurality of parallel conductive lines in the etch target layer.

18. The method of claim 15, wherein etching the sacrificial layer and the etch target layer using the third mask layer pattern, the first mask layer pattern and the second mask layer pattern as a mask to thereby form a plurality of parallel first trenches in the etch target layer between the line portions of the first and second mask layer patterns in the first region and a second trench in the second region comprises:
selectively etching the sacrificial layer using the third mask layer pattern as a mask to expose the etch target layer; and
etching the etch target layer using the first mask layer pattern and the second mask layer pattern to form the plurality of parallel first trenches.

19. A method of forming a semiconductor device pattern, comprising:
forming an etch target layer on a semiconductor substrate comprising a first region and a second region;
forming a first mask layer pattern comprising a plurality of parallel line portions on the etch target layer in the first region;
forming a sacrificial layer having a uniform thickness on the first mask layer pattern;
forming a second mask layer pattern on the sacrificial layer, the second mask layer pattern comprising respective parallel line portions disposed between respective adjacent ones of the parallel line portions of the first mask layer pattern in the first region, wherein adjacent line portions of the first mask layer pattern and the second mask layer pattern are separated by the sacrificial layer;
forming a mask layer on the second mask layer pattern to thereby form a planar surface in the first region and the second region;
forming a fourth mask layer pattern on the mask layer; and
etching the mask layer using the fourth mask layer pattern as a mask to form a third mask layer pattern comprising first and second portions covering respective first and second ends of the line portions of the first mask layer pattern and the second mask layer pattern and having an opening at the line portions of the first and second mask layer patterns between the first and second ends in the first region and a third portion having an opening in the second region; and etching the sacrificial layer and the etch target layer using the third mask layer pattern, the first mask layer pattern and the second mask layer pattern as a mask to thereby form a plurality of parallel first trenches in the etch target layer between the line portions of the first and second mask layer patterns in the first region and a second trench in the second region.

20. The method of claim 19, wherein the mask layer comprises one of a spin on hardmask (SOH) layer and a spin on glass (SOG) layer.

* * * * *